United States Patent
Yano et al.

(10) Patent No.: US 8,868,842 B2
(45) Date of Patent: Oct. 21, 2014

(54) MEMORY SYSTEM, METHOD OF CONTROLLING MEMORY SYSTEM, AND INFORMATION PROCESSING APPARATUS

(75) Inventors: Hirokuni Yano, Tokyo (JP); Ryoichi Kato, Kanagawa (JP); Toshikatsu Hida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 756 days.

(21) Appl. No.: 13/063,210

(22) PCT Filed: Dec. 28, 2009

(86) PCT No.: PCT/JP2009/071918
§ 371 (c)(1),
(2), (4) Date: Mar. 10, 2011

(87) PCT Pub. No.: WO2010/074352
PCT Pub. Date: Jul. 1, 2010

(65) Prior Publication Data
US 2011/0238899 A1 Sep. 29, 2011

(30) Foreign Application Priority Data

Dec. 27, 2008 (JP) ................................. 2008-335568

(51) Int. Cl.
G06F 12/00 (2006.01)
G06F 13/00 (2006.01)
G06F 13/28 (2006.01)
G06F 12/12 (2006.01)
G06F 12/08 (2006.01)
G11C 16/10 (2006.01)
G11C 16/04 (2006.01)
G06F 12/02 (2006.01)

(52) U.S. Cl.
CPC .......... *G06F 12/0804* (2013.01); *G06F 12/126* (2013.01); *G11C 16/10* (2013.01); *G06F 12/0866* (2013.01); *G11C 16/0483* (2013.01); *G06F 2212/2022* (2013.01); *G06F 12/128* (2013.01); *G06F 12/0246* (2013.01); *G06F 2212/7201* (2013.01)
USPC ........... 711/135; 711/133; 711/134; 711/136; 711/159; 711/160; 711/103; 711/115

(58) Field of Classification Search
None
See application file for complete search history.

(56) References Cited

U.S. PATENT DOCUMENTS 5,542,066 A * 7/1996 Mattson et al. ............... 711/136
5,862,083 A 1/1999 Tobita et al.
(Continued)

FOREIGN PATENT DOCUMENTS

CN 101241477 A 8/2008
JP 7 146820 6/1995
(Continued)

OTHER PUBLICATIONS

International Search Report issued Apr. 13, 2010 in PCT/JP09/071918 filed Dec. 28, 2009.
(Continued)

Primary Examiner — Yaima Rigol
(74) Attorney, Agent, or Firm — Oblon, Spivak, McClelland, Maier & Neustadt, L.L.P.

(57) ABSTRACT

A WC resource usage is compared with an auto flush (AU) threshold Caf that is smaller than an upper limit Clmt, and when the WC resource usage exceeds the AF threshold Caf, the organizing state of a NAND memory 10 is checked. When the organizing of the NAND memory 10 has proceeded sufficiently, data is flushed from a write cache (WC) 21 to the NAND memory 10 early, so that the response to the subsequent write command is improved.

29 Claims, 22 Drawing Sheets

(56) References Cited

U.S. PATENT DOCUMENTS

| | | | |
|---|---|---|---|
| 7,657,701 B2 * | 2/2010 | Shanmuganathan | 711/103 |
| 7,870,338 B2 | 1/2011 | Iida et al. | |
| 7,904,640 B2 | 3/2011 | Yano et al. | |
| 8,190,822 B2 | 5/2012 | Iida et al. | |
| 2005/0195635 A1 | 9/2005 | Conley et al. | |
| 2006/0064549 A1 | 3/2006 | Wintergerst | |
| 2007/0028035 A1 | 2/2007 | Nishihara | |
| 2007/0174578 A1 | 7/2007 | Oshima | |
| 2007/0255898 A1 | 11/2007 | Nishide et al. | |
| 2008/0168220 A1 * | 7/2008 | Gill et al. | 711/113 |
| 2008/0189484 A1 | 8/2008 | Iida et al. | |
| 2008/0189485 A1 | 8/2008 | Jung et al. | |
| 2008/0301201 A1 | 12/2008 | Sugimoto et al. | |
| 2009/0006725 A1 | 1/2009 | Ito et al. | |
| 2009/0157974 A1 * | 6/2009 | Lasser | 711/135 |
| 2009/0172286 A1 * | 7/2009 | Lasser et al. | 711/127 |
| 2009/0222616 A1 | 9/2009 | Yano et al. | |
| 2009/0222617 A1 | 9/2009 | Yano et al. | |
| 2009/0222628 A1 | 9/2009 | Yano et al. | |
| 2009/0222629 A1 | 9/2009 | Yano et al. | |
| 2009/0222636 A1 | 9/2009 | Yano et al. | |
| 2009/0228642 A1 | 9/2009 | Yano et al. | |
| 2009/0235015 A1 | 9/2009 | Hatsuda et al. | |
| 2009/0235016 A1 | 9/2009 | Yano et al. | |
| 2009/0240871 A1 | 9/2009 | Yano et al. | |
| 2009/0241010 A1 | 9/2009 | Yano et al. | |
| 2009/0248964 A1 | 10/2009 | Yano et al. | |
| 2010/0037009 A1 | 2/2010 | Yano et al. | |
| 2010/0037010 A1 | 2/2010 | Yano et al. | |
| 2010/0037011 A1 | 2/2010 | Yano et al. | |
| 2010/0037012 A1 | 2/2010 | Yano et al. | |
| 2010/0049907 A1 | 2/2010 | Kitsunai et al. | |
| 2010/0077266 A1 | 3/2010 | Kanno et al. | |
| 2010/0138591 A1 | 6/2010 | Yano et al. | |
| 2010/0146228 A1 | 6/2010 | Kanno et al. | |
| 2010/0153626 A1 | 6/2010 | Yano et al. | |
| 2010/0199025 A1 | 8/2010 | Nanjou et al. | |
| 2010/0223424 A1 | 9/2010 | Kitsunai et al. | |
| 2010/0281204 A1 | 11/2010 | Yano et al. | |
| 2010/0312948 A1 | 12/2010 | Yano et al. | |
| 2010/0313084 A1 | 12/2010 | Hida et al. | |
| 2011/0022784 A1 | 1/2011 | Yano et al. | |
| 2011/0078379 A1 | 3/2011 | Iida et al. | |

FOREIGN PATENT DOCUMENTS

| | | |
|---|---|---|
| JP | 11-288387 | 10/1999 |
| JP | 2000-89983 | 3/2000 |
| JP | 3688835 | 8/2005 |
| JP | 2007 058840 | 3/2007 |
| JP | 2007 528079 | 10/2007 |
| JP | 2008 299441 | 12/2008 |
| WO | 2009 028281 | 3/2009 |
| WO | 2009 041153 | 4/2009 |
| WO | 2009 084724 | 7/2009 |
| WO | 2009 110126 | 9/2009 |
| WO | 2009 110303 | 9/2009 |

OTHER PUBLICATIONS

U.S. Appl. No. 12/529,145, filed Aug. 28, 2009, Yano, et al.
U.S. Appl. No. 12/259,127, filed Aug. 28, 2009, Yano, et al.
U.S. Appl. No. 12/529,192, filed Aug. 31, 2009 Yano, et al.
U.S. Appl. No. 12/529,227, filed Aug. 31, 2009, Yano, et al.
U.S. Appl. No. 12/529,228, filed Aug. 31, 2009, Yano, et al.
U.S. Appl. No. 12/529,235, filed Aug. 31, 2009, Yano, et al.
U.S. Appl. No. 12/984,337, filed Jan. 4, 2011, Yano, et al.
Office Action issued Feb. 16, 2013 in Chinese Application No. 200980135254.1 (With English Translation).
U.S. Appl. No. 13/052,146, filed Mar. 21, 2011, Ootsuka, et al.
U.S. Appl. No. 13/613,379, filed Sep. 13, 2012, Morita.
U.S. Appl. No. 13/599,087, filed Aug. 30, 2012, Yonezawa, et al.
U.S. Appl. No. 13/609,991, filed Sep. 11, 2012, Hirao, et al.
Office Action issued Jun. 6, 2013 in Taiwanese Patent Application No. 098145327 (with English language translation).
U.S. Appl. No. 13/326,872, filed Dec. 15, 2011, Hirao, et al.
U.S. Appl. No. 13/328,496, filed Dec. 16, 2011, Hida, et al.
U.S. Appl. No. 13/328,420, filed Dec. 16, 2011, Yonezawa, et al.
U.S. Appl. No. 12/884,844, filed Sep. 17, 2010, Yano, et al.
U.S. Appl. No. 13/237,396, filed Sep. 20, 2011, Morita.
U.S. Appl. No. 13/238,675, filed Sep. 21, 2011, Norimatsu, et al.
Office Action issued Sep. 18, 2012 in Japanese Patent Application No. 2008-335568 (with English translation).
Extended European Search Report issued Aug. 2, 2012, in Patent Application No. 09835127.3.
Chinese Office Action issued Oct. 12, 2013 in Patent Application No. 200980135254.1 with English Translation.

* cited by examiner

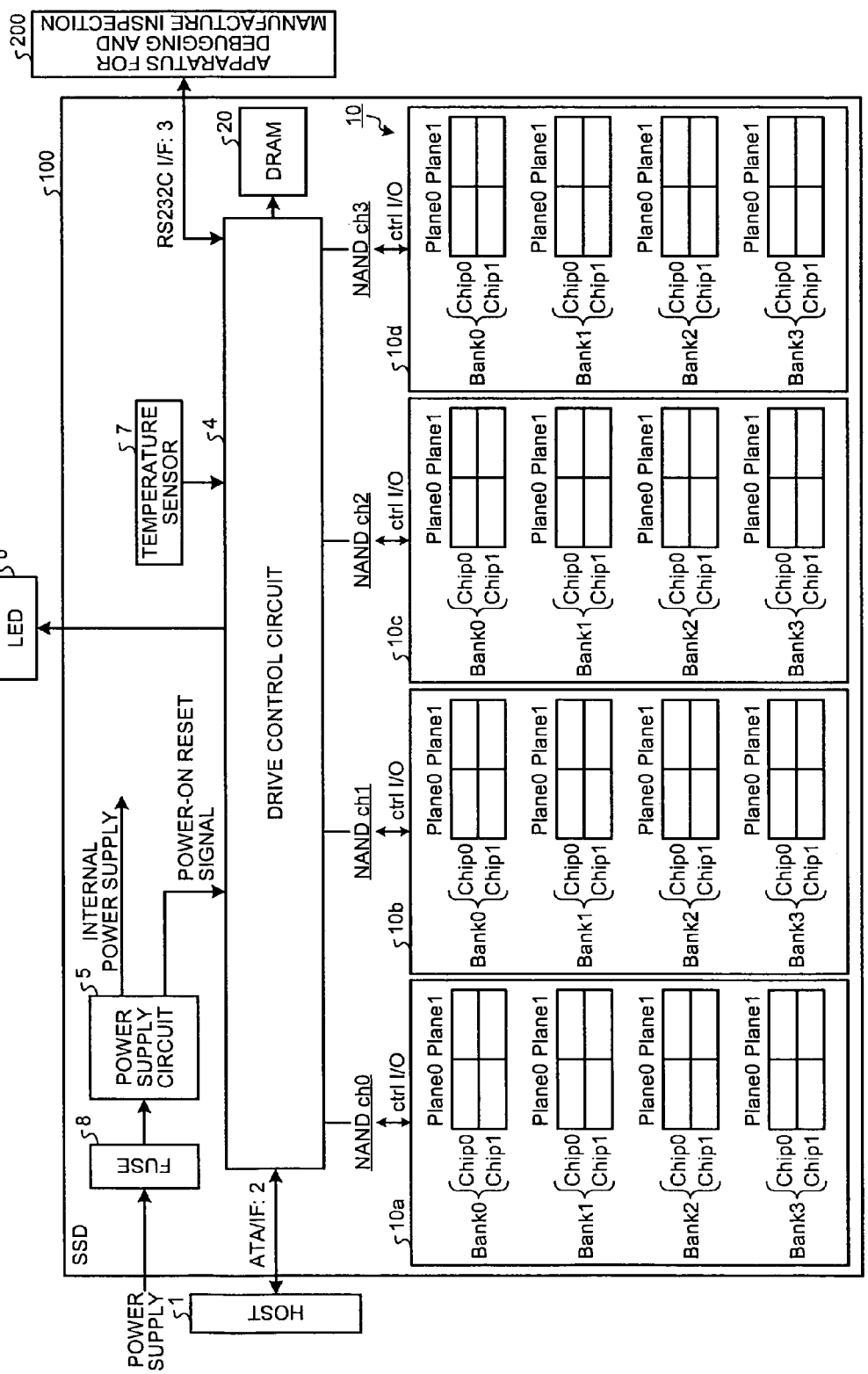

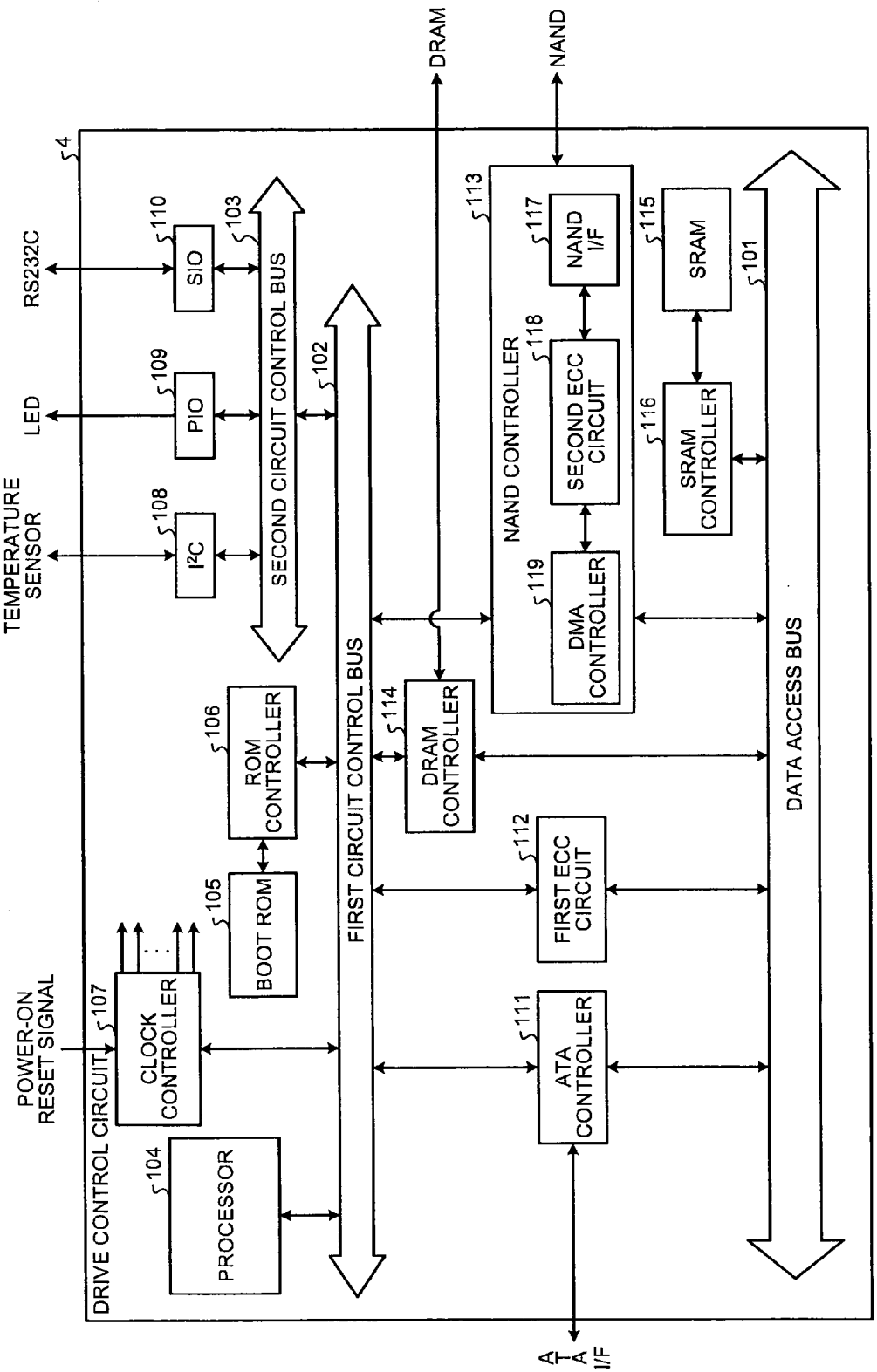

FIG.20

| PARAMETER NAME | MAXIMUM VALUE MAX | AF THRESHOLD CAf | UPPER LIMIT Clmt |
|---|---|---|---|
| WC CLUSTER AREA (MB) | Z | Z/2 | (7/8 ~ 15/16)Z |
| NUMBER OF TRACKS TO MS (FOR EACH BANK) | m | m/2 | (6/8 ~ 7/8)m |
| NUMBER OF CLUSTERS TO FS (MB) | Q | Q/4 | (6/8 ~ 7/8)Q |
| NUMBER OF WC TRACK INFORMATION | (g×n) | (g×n)/2 | ✕ |
| NUMBER OF USED ENTRIES FOR EACH INDEX OF WC TRACK TABLE | n | ✕ | ONE REMAINING |
| NUMBER OF FULL TRACKS | ✕ | y | ✕ |

α3, α4, α5, α2, α1, α6

MEMORY SYSTEM, METHOD OF CONTROLLING MEMORY SYSTEM, AND INFORMATION PROCESSING APPARATUS

TECHNICAL FIELD

The present invention relates to a memory system including a nonvolatile semiconductor memory.

BACKGROUND ART

As an external storage device used in a computer system, an SSD (Solid State Drive) mounted with a nonvolatile semiconductor memory such as a NAND-type flash memory attracts attention. The flash memory has advantages such as high speed and lightweight compared with a magnetic disk device. The SSD includes therein a plurality of flash memory chips, a controller that performs read/write control of each flash memory chip corresponding to a request from a host device, a buffer memory for performing data transfer between each flash memory chip and the host device, a power supply circuit, a connection interface for the host device (for example, Patent Document 1: Japanese Patent No. 3688835).

When data is stored in a nonvolatile semiconductor storage element such as a NAND-type flash memory, writing is performed after once erasing data in units of so-called block, reading/writing is performed in units of so-called page, or a unit of erasing/reading/writing is fixed. On the other hand, a unit of reading/writing of data from/to a secondary storage such as a hard disk by a host device such as a personal computer (PC) is called a sector. The sector is set independently from a unit of erasing/reading/writing of a semiconductor storage element. Typically, a size of the block, the page, and the sector has a relationship of block>page>sector.

In this manner, a unit of erasing/reading/writing of a semiconductor storage element is larger than a unit of reading/writing of a host device in some cases. When a secondary storage of a PC such as a hard disk is configured by using such a semiconductor storage element, small size data from the PC as the host device needs to be subjected to an address translation after conforming to a block size and a page size of the semiconductor storage element.

Moreover, when a secondary storage with a large capacity is configured by using such a flash memory, a cache memory is often interposed between the flash memory and a host device to reduce the number of times of writing (the number of times of erasing) in the flash memory as described in Patent Document 2 (Japanese translation of PCT international application No. 2007-528079).

DISCLOSURE OF INVENTION

One aspect of this invention is to provide a memory system comprising: a cache memory; a nonvolatile semiconductor memory in which data is written via the cache memory; an organizing unit that, when a resource usage of the nonvolatile semiconductor memory exceeds a specific value, increases a resource of the nonvolatile semiconductor memory by organizing the data in the nonvolatile semiconductor memory; a first flush control unit that performs first flush processing for flushing data in the cache memory to the nonvolatile semiconductor memory until the resource usage of the cache memory becomes equal to or less than a first threshold when the resource usage of the cache memory exceeds the first threshold and is smaller than a second threshold that is larger than the first threshold and an organizing by the organizing unit is finished; and a second flush control unit that performs second flush processing for flushing the data in the cache memory to the nonvolatile semiconductor memory until the resource usage of the cache memory becomes equal to or less than the second threshold when the resource usage of the cache memory exceeds the second threshold and the organizing by the organizing unit is finished, and flushing the data in the cache memory to the nonvolatile semiconductor memory after the organizing by the organizing unit is finished when the resource usage of the cache memory exceeds the second threshold and the organizing by the organizing unit is not finished.

BRIEF DESCRIPTION OF DRAWINGS

FIG. 1 is a block diagram of a configuration example of an SSD.

FIG. 3 is a block diagram of a hardware internal configuration example of a drive control circuit.

FIG. 20 is a diagram illustrating a relationship between a WC resource name (parameter name), and an auto flush (AF) threshold and an upper limit.

BEST MODE(S) FOR CARRYING OUT THE INVENTION

Figure 2A:
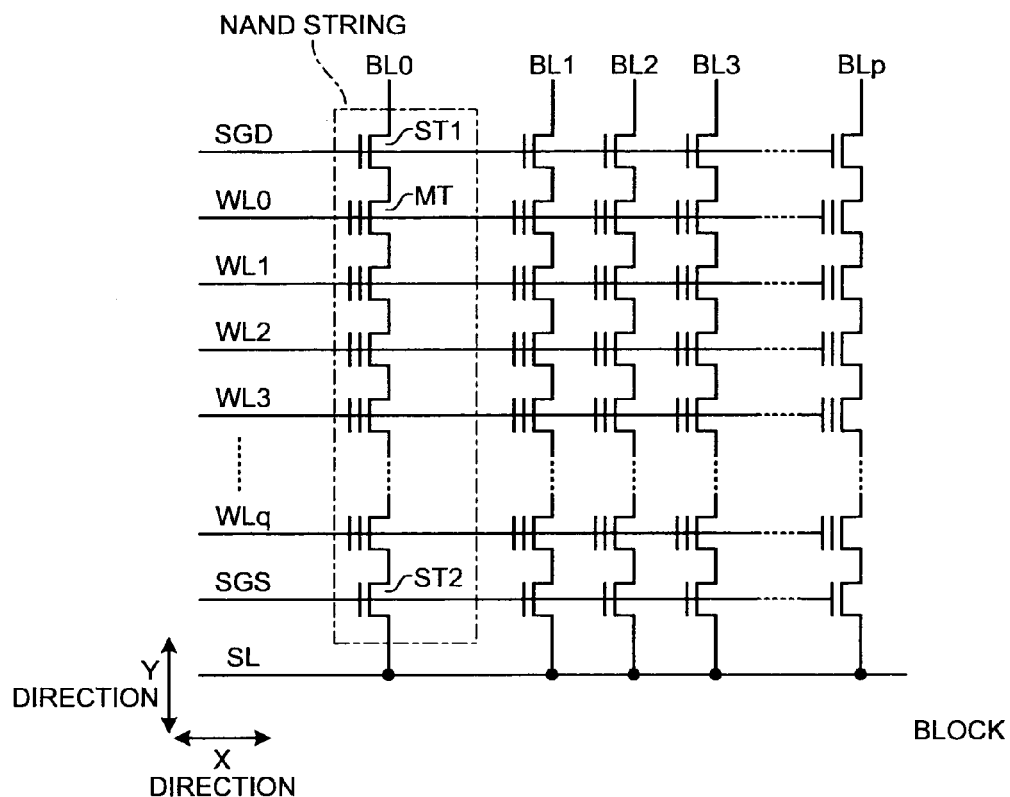
FIGS. 2A and 2B are diagrams illustrating a configuration example of one block included in a NAND memory chip and a threshold distribution in a quaternary data storage system.

In a case of writing from a host device to a cache memory, when the cache memory is full, data is flushed from the cache memory to a flash memory and then the data is written in the cache memory. However, if the data flushing is performed after the cache memory becomes almost full, a write request from the host device is kept waiting during the data flushing, so that a secondary storage with a high response when viewed from the side of the host device cannot be configured.

Moreover, as described above, when a data erasing unit (block) and a data management unit are different, according to the progress of rewriting of a flash memory, blocks are made porous by invalid (non-latest) data. When the blocks in such a porous state increase, substantially usable blocks decrease and a storage area of the flash memory cannot be effectively used. Therefore, organizing processing of the flash memory called compaction for collecting valid latest date and rewriting the data in a different block is performed.

However, in conventional flush processing of a cache memory does not consider the organizing state on the flash memory side, so that it takes time to perform the writing to the flash memory when the organizing on the flash memory side has not proceeded. Consequently, the response to a write command on the host side may be lowered.

Exemplary embodiments of a memory system according to the present invention are explained in detail below with reference to the accompanying drawings. The present invention is not limited to these embodiments.

Embodiments of the present invention are explained below with reference to the drawings. In the following explanation, components having the same functions and configurations are denoted by the same reference numerals and signs. Redundant explanation of the components is performed only when necessary.

First, terms used in the specification are defined.

Physical page: A unit that can be collectively written and read out in a NAND-type flash memory.

Logical page: A writing and readout unit set in an SSD. The logical page is associated with one or more physical pages.

Physical block: A minimum unit that can be independently erased in the NAND-type flash memory. The physical block includes a plurality of physical pages.

Logical block: An erasing unit set in the SSD. The logical block is associated with one or more physical blocks. The logical block includes a plurality of logical pages.

Sector: A minimum access unit from a host. A sector size is, for example, 512 bytes (B).

Cluster: A management unit for managing "small data (fine grained data)" in the SSD. A cluster size is equal to or larger than the sector size and is set to be equal to a data management unit of a file system that an operating system (OS) of a host employs or a logical page size. For example, the cluster size can be set such that a size twice or larger natural number times as large as the cluster size is the logical page size.

Track: A management unit for managing "large data (coarse grained data)" in the SSD. A track size is set such that a size twice or larger natural number times as large as the cluster size is the track size. For example, the track size can be set equal to the logical block size.

Free block (FB): A logical block which does not include valid data therein and for which a use is not allocated. The free block includes the following two types, i.e., a complete free block (CFB) and a fragment free block (FFB).

Complete free block (CFB): A free block on which an erasing operation needs to be performed for reuse. After performing the erasing operation, writing can be performed from a logical page positioned at the top of a logical block.

Fragment free block (FFB): A free block in which a logical page with no data written therein remains and which can be reused without performing the erasing operation. Writing can be performed in the remaining logical page with no data written therein.

Bad block (BB): A physical block on the NAND-type flash memory that cannot be used as a storage area because of a large number of errors. For example, a physical block for which the erasing operation is not normally finished is registered as the bad block BB.

Writing efficiency: A statistical value of an erasing amount of the logical block with respect to a data amount written from the host in a specific period. As the writing efficiency is smaller, a wear degree of the NAND-type flash memory is smaller.

Valid cluster: A cluster that stores latest data (cluster-sized data) corresponding to a logical address.

Invalid cluster: A cluster that stores non-latest data (cluster-sized data) not to be referred as a result that data having an identical logical address is written in a different location.

Valid track: A track that stores latest data (track-sized data) corresponding to a logical address.

Invalid track: A track that stores non-latest data (track-sized data) not to be referred as a result that data having an identical logical address is written in a different location.

Multi level cell (MLC) mode: Mode in which writing is normally performed using an upper page and a lower page in a NAND-type flash memory capable of multi-valued storage. A logical block of the MLC mode is configured by associating with one or more physical blocks used in the MLC mode.

Pseudo single level cell (SLC) mode: Mode in which writing is performed using only a lower page in a NAND-type flash memory capable of multi-valued storage. A logical block of the pseudo SLC mode is configured by associating with one or more physical blocks used in the pseudo SLC mode. Even a physical block used once in the pseudo SLC mode can be used in the MLC mode after the erasing operation.

First Embodiment

FIG. 1 is a block diagram of a configuration example of an SSD 100. The SSD 100 is connected to a host device 1 (hereinafter, host 1) such as a PC or a central processing unit (CPU) core via a memory connection interface such as an advanced technology attachment interface (ATA I/F) 2 and functions as an external memory of the host 1. The SSD 100 can transmit data to and receive data from an apparatus for debugging and manufacture inspection 200 via a communication interface 3 such as an RS232C I/F. The SSD 100 includes a NAND-type flash memory (hereinafter, NAND memory) 10 as a nonvolatile semiconductor memory, a drive control circuit 4 as a controller, a DRAM 20 as a volatile semiconductor memory, a power supply circuit 5, a light-emitting diode (LED) for state display 6, a temperature sensor 7 that detects a temperature in a drive, and a fuse 8.

The power supply circuit 5 generates a plurality of different internal direct current (DC) power supply voltages from external DC power supplied from a power supply circuit on the host 1 side and supplies these internal DC power supply voltages to respective circuits in the SSD 100. The power supply circuit 5 detects a rising edge of an external power supply, generates a power-on reset signal, and supplies the power-on reset signal to the drive control circuit 4. The fuse 8 is provided between the power supply circuit on the host 1 side and the power supply circuit 5 in the SSD 100. When an overcurrent is supplied from an external power supply circuit, the fuse 8 is disconnected to prevent malfunction of the internal circuits.

In this case, the NAND memory 10 includes four parallel operation elements 10a to 10d that perform four parallel operations. The parallel operation elements 10a to 10d are connected to the drive control circuit 4 by four channels (ch0 to ch3). Each of the parallel operation elements 10a to 10d includes a plurality of banks (in this case, four banks (Bank0 to Bank3)) capable of performing bank interleave. Each bank includes a plurality of NAND memory chips (in this case, two memory chips (Chip0 and Chip1)). Each memory chip is divided into, for example, two districts of a plane 0 and a plane 1 each of which includes a plurality of physical blocks. The plane 0 and the plane 1 include peripheral circuits independent from each other (e.g., a row decoder, a column decoder, a page buffer, and a data cache) and can simultaneously perform erasing, writing, and readout by using a double speed mode. In this manner, each NAND memory chip of the NAND memory 10 can perform the parallel operation by a plurality of channels, the bank interleave operation by a plurality of banks, and the parallel operation by the double speed mode using a plurality of planes. Each memory chip can be divided into four planes or be configured without being divided.

The DRAM 20 functions as a cache for data transfer between the host 1 and the NAND memory 10 and a memory for a work area. In the memory for the work area of the DRAM 20, a master table (snapshot) that is obtained by loading various management tables stored in the NAND memory 10 at the time of start-up or the like, log information that is a change difference of a management table, and the like are stored. A ferroelectric random access memory (FeRAM), a magnetoresistive random access memory (MRAM), a phase change random access memory (PRAM), or the like can be used instead of the DRAM 20. The drive control circuit 4 performs data transfer control between the host 1 and the NAND memory 10 via the DRAM 20 and controls the respective components in the SSD 100. The drive control circuit 4 supplies a signal for status display to the LED for state display 6. The drive control circuit 4 also has a function of receiving a power-on reset signal from the power supply circuit 5 and supplying a reset signal and a clock signal to respective units in the own circuit and the SSD 100.

Each NAND memory chip is configured by arranging a plurality of physical blocks as a unit of data erasing. FIG. 2A is an equivalent circuit diagram illustrating a configuration example of one physical block included in a NAND memory chip. Each physical block includes (p+1) NAND strings arranged in order along the X direction (p is an integer equal to or greater than 0). Selection transistors ST1 included in the respective (p+1) NAND strings are such that drains are connected to bit lines BL0 to BLp, respectively, and gates are connected to a gate line SGD in common. Moreover, selection transistors ST2 are such that sources are connected to a source line SL in common and gates are connected to a gate line SGS in common.

Each of memory cell transistors MT includes a metal oxide semiconductor field effect transistor (MOSFET) including the stacked gate structure formed on a semiconductor substrate. The stacked gate structure includes a charge storage layer (a floating gate electrode) formed on the semiconductor substrate via a gate insulating film and a control gate electrode formed on the charge storage layer via an inter-gate insulating film. In the memory cell transistors MT, a threshold voltage changes according to the number of electrons accumulated in the floating gate electrode. The memory cell transistor MT stores data according to a difference in the threshold voltage. The memory cell transistor MT can be configured to store one bit or can be configured to store multiple values (data equal to or larger than two bits).

The memory cell transistor MT is not limited to the structure having the floating gate electrode and can be the structure such as a metal-oxide-nitride-oxide-silicon (MONOS) type that can adjust a threshold by causing a nitride film interface as a charge storage layer to trap electrons. Similarly, the memory cell transistor MT of the MONOS structure can be configured to store one bit or can be configured to store multiple values (data equal to or larger than two bits).

In each of the NAND strings, (q+1) memory cell transistors MT are arranged between a source of the selection transistor ST1 and a drain of the selection transistor ST2 such that current paths thereof are connected in series. In other words, the memory cell transistors MT are connected in series in a Y direction such that adjacent ones of the memory cell transistors MT share a diffusion region (a source region or a drain region).

Control gate electrodes of the memory cell transistors MT are connected to word lines WL0 to WLq, respectively, in order from the memory cell transistor MT located on the most drain side. Therefore, a drain of the memory cell transistor MT connected to the word line WL0 is connected to the source of the selection transistor ST1. A source of the memory cell transistor MT connected to the word line WLq is connected to the drain of the selection transistor ST2.

The word lines WL0 to WLq connect the control gate electrodes of the memory cell transistors MT in common among the NAND strings in the physical block. In other words, the control gate electrodes of the memory cell transistors MT present in an identical row in the block are connected to an identical word line WL. (p+1) memory cell transistors MT connected to the identical word line WL are treated as one page (physical page). Data writing and data readout are performed by each physical page.

The bit lines BL0 to BLp connect drains of the selection transistors ST1 in common among the blocks. In other words, the NAND strings present in an identical column in a plurality of blocks are connected to an identical bit line BL.

Figure 2B:
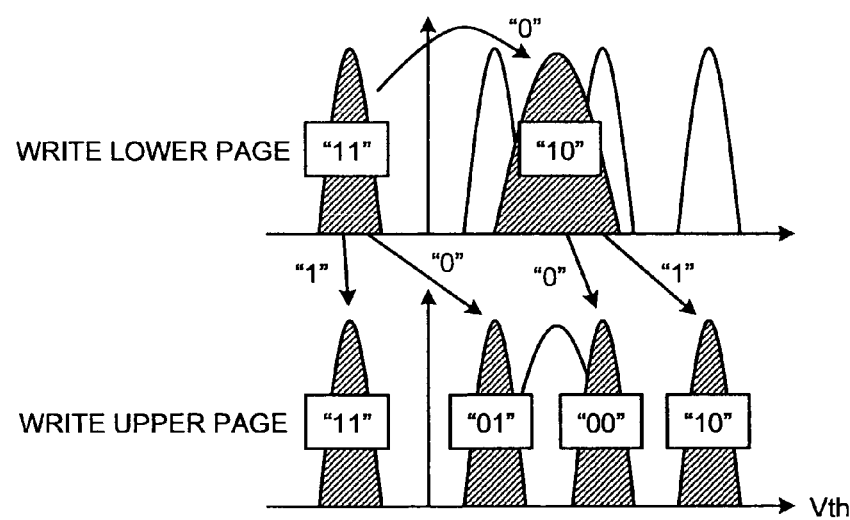

FIG. 2B is a schematic diagram of a threshold distribution, for example, in a quaternary data storage mode for storing two bits in one memory cell transistor MT. In the quaternary data storage mode, any one of quaternary data "xy" defined by upper page data "x" and lower page data "y" can be stored in the memory cell transistor MT.

As the quaternary data "xy", for example, data "11", "01", "00", and "10" are allocated in order of threshold voltages of the memory cell transistor MT. The data "11" is an erased state in which the threshold voltage of the memory cell transistor MT is negative. The rule of allocation of data is not limited thereto. The configuration can be such that three or more bits are stored in one memory cell transistor MT.

In a lower page writing operation, the data "10" is selectively written in the memory cell transistor MT having the data "11" (in the erased state) according to the writing of the lower bit data "y". A threshold distribution of the data "10" before upper page writing is located about in the middle of threshold distributions of the data "01" and the data "00" after the upper page writing and can be broader than a threshold distribution after the upper page writing. In an upper page writing operation, writing of upper bit data "x" is selectively applied to a memory cell of the data "11" and a memory cell of the data "10". The data "01" and the data "00" are written in the memory cells. In the pseudo SLC mode, writing is performed using only the lower page. The lower page writing is faster than the upper page writing.

FIG. 3 is a block diagram of a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105, in which a boot program for booting respective management programs (FW: firmware) stored in the NAND memory 10 is stored, is connected to the first circuit control bus 102 via a ROM controller 106. A clock controller 107 that receives the power-on rest signal from the power supply circuit 5 shown in FIG. 1 and supplies a reset signal and a clock signal to the respective units is connected to the first circuit control bus 102.

The second circuit control bus 103 is connected to the first circuit control bus 102. An I²C circuit 108 for receiving data from the temperature sensor 7 shown in FIG. 1, a parallel IO (PIO) circuit 109 that supplies a signal for status display to the LED for state display 6, and a serial IO (SIO) circuit 110 that controls the RS232C I/F 3 are connected to the second circuit control bus 103.

An ATA interface controller (ATA controller) 111, a first error checking and correction (ECC) circuit 112, a NAND controller 113, and a DRAM controller 114 are connected to both of the data access bus 101 and the first circuit control bus 102. The ATA controller 111 transmits data to and receives data from the host 1 via the ATA interface 2. A static random access memory (SRAM) 115 used as a data work area and a firmware expansion area is connected to the data access bus 101 via an SRAM controller 116. When the firmware stored in the NAND memory 10 is started, the firmware is transferred to the SRAM 115 by the boot program stored in the boot ROM 105.

The NAND controller 113 includes a NAND I/F 117 that performs interface processing for interface with the NAND memory 10, a second ECC circuit 118, and a direct memory access (DMA) controller for DMA transfer control 119 that performs access control between the NAND memory 10 and the DRAM 20. The second ECC circuit 118 performs encode of a second correction code and performs encode and decode of a first error correction code. The first ECC circuit 112 performs decode of a second error correction code. The first error correction code and the second error correction code are, for example, a Hamming code, a Bose Chaudhuri Hocquenghem (BCH) code, a Reed Solomon (RS) code, or a low density parity check (LDPC) code. Correction ability of the second error correction code is higher than correction ability of the first error correction code. A technology related to such error correction is disclosed, for example, in International Patent Application PCT/JP2008/063344 or International Patent Application PCT/JP2008/063345, and the whole content thereof is incorporated in the present application.

As shown in FIG. 1, in the NAND memory 10, the four parallel operation elements 10a to 10d are connected in parallel to the NAND controller 113 in the drive control circuit 4 via four channels (4ch) each for a plurality of bits, so that the four parallel operation elements 10a to 10d can be actuated in parallel. The NAND memory 10 of each channel is divided into four banks capable of the bank interleave, and can access to the plane 0 and the plane 1 of each memory chip simultaneously. Therefore, processing such as writing can be performed almost simultaneously on up to eight physical blocks (4 banks×2 planes) for each channel. A technology related to such bank interleave is disclosed, for example, in U.S. patent application Publication Ser. No. 12/558,965, and the whole content thereof is incorporated in the present application.

Figure 4:
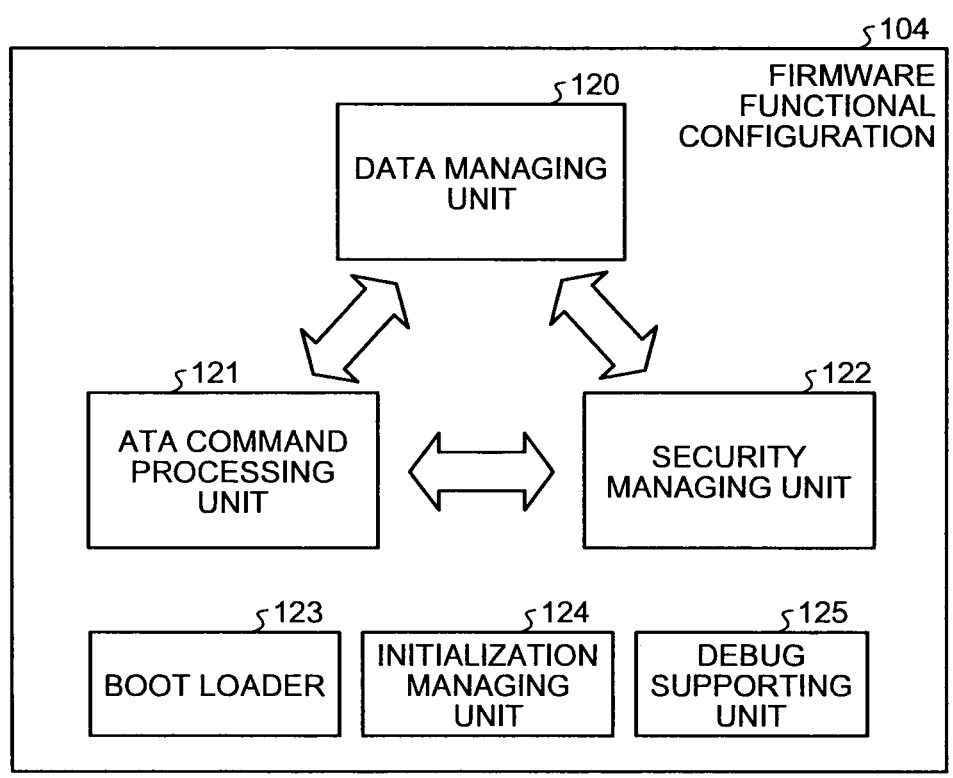
FIG. 4 is a block diagram of a functional configuration example of a processor.

FIG. 4 is a block diagram of a functional configuration example of a firmware realized by the processor 104. Functions of the firmware realized by the processor 104 are roughly classified into a data managing unit 120, an ATA-command processing unit 121, a security managing unit 122, a boot loader 123, an initialization managing unit 124, and a debug supporting unit 125.

The data managing unit 120 controls data transfer between the NAND memory 10 and the DRAM 20 and various functions concerning the NAND memory 10 via the NAND controller 113 and the first ECC circuit 112. The ATA-command processing unit 121 performs data transfer processing between the DRAM 20 and the host 1 in cooperation with the data managing unit 120 via the ATA controller 111 and the DRAM controller 114. The security managing unit 122 manages various kinds of security information in cooperation with the data managing unit 120 and the ATA-command processing unit 121.

The boot loader 123 loads, when a power supply is turned on, the management programs (firmware) from the NAND memory 10 onto the SRAM 115. The initialization managing unit 124 performs initialization of respective controllers and circuits in the drive control circuit 4. The debug supporting unit 125 processes data for debug supplied from the outside via the RS232C interface. The data managing unit 120, the ATA-command processing unit 121, and the security managing unit 122 are mainly functional units realized by the processor 104 executing various management programs stored in the SRAM 115.

In the present embodiment, functions realized by the data managing unit 120 are mainly explained. The data managing unit 120 performs, for example, provision of functions that the ATA-command processing unit 121 requests the NAND memory 10 and the DRAM 20 as storage devices (in response to various commands such as a write request, a cache flush request, and a read request from the host), management of a correspondence relation between a logical address given from the host 1 and a physical address of the NAND memory 10, protection of management information by a snapshot and a log, provision of fast and highly efficient data readout and writing functions using the DRAM 20 and the NAND memory 10, and ensuring of reliability of the NAND memory 10.

Figure 5:
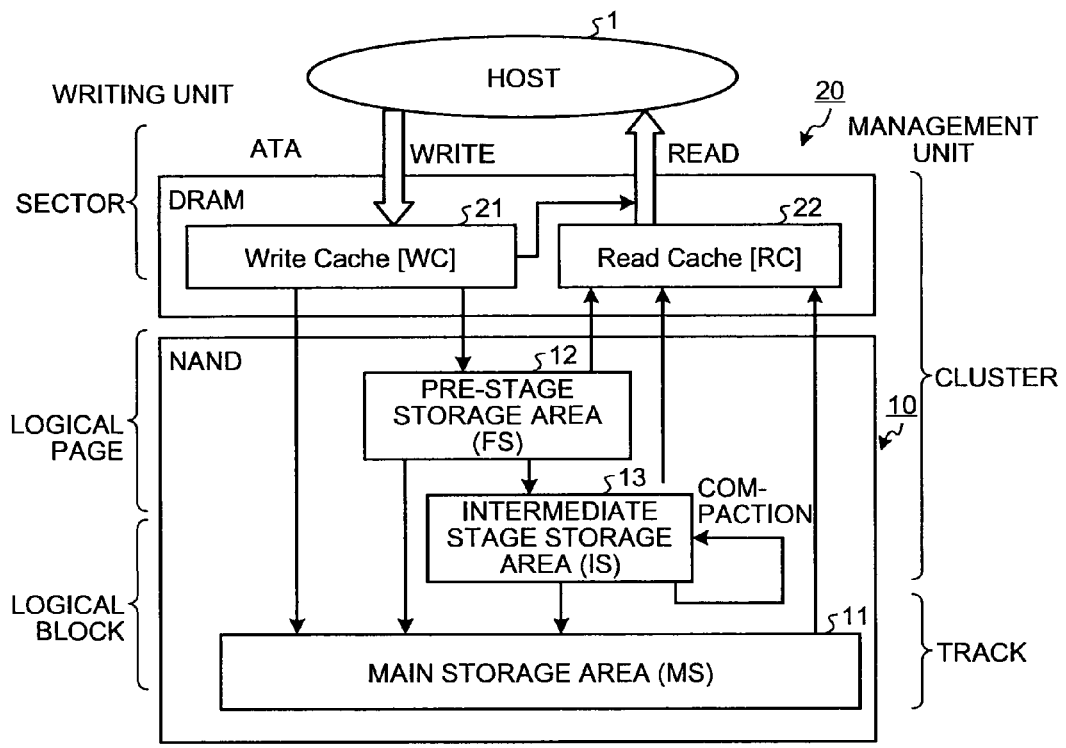
FIG. 5 is a block diagram of a functional configuration formed in a NAND memory and a dynamic random access memory (DRAM).

FIG. 5 is a diagram of functional blocks formed in the NAND memory 10 and the DRAM 20. A write cache (WC) 21 and a read cache (RC) 22 configured on the DRAM 20 are interposed between the host 1 and the NAND memory 10. The WC 21 temporarily stores therein Write data from the host 1. The RC 22 temporarily stores therein Read data from the NAND memory 10. The blocks in the NAND memory 10 are allocated to respective management areas of a pre-stage storage area (FS: Front Storage) 12, an intermediate stage storage area (IS: Intermediate Storage) 13, and a main storage area (MS: Main Storage) 11 by the data managing unit 120 in order to reduce an amount of erasing for the NAND memory 10 during writing. The FS 12 manages data from the WC 21 in cluster units, i.e., "small units" and stores small data for a short period. The IS 13 manages data overflowing from the FS 12 in cluster units, i.e., "small units" and stores small data for a long period. The MS 11 manages data from the WC 21, the FS 12, and the IS 13 in track units, i.e., "large units". A technology for managing blocks in the NAND memory 10 by allocating them in each management area in this manner is disclosed, for example, in International Patent Application PCT/JP08/073,950 or International Patent Application PCT/JP08/067,600, and the whole content thereof is incorporated in the present application.

Figure 6:
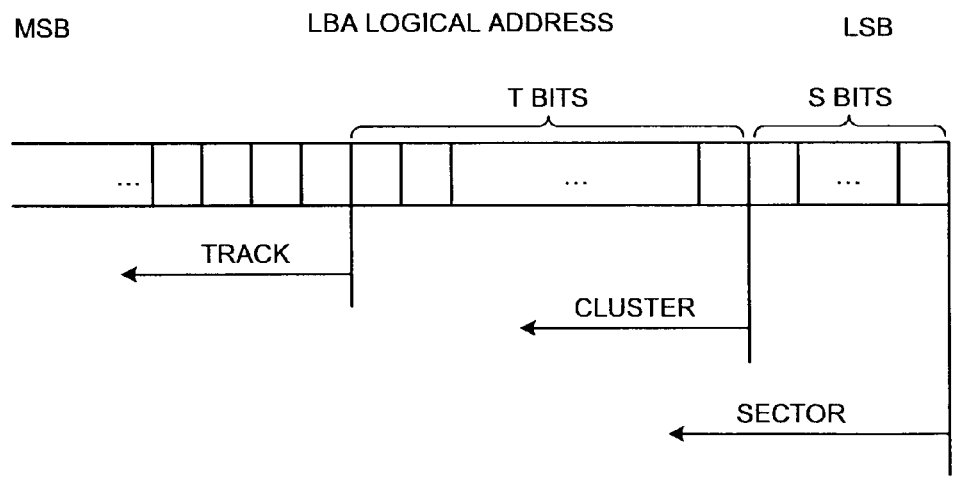
FIG. 6 is a diagram illustrating an LBA logical address.

Specific functional configurations of the respective components shown in FIG. 5 are explained in detail. When the host 1 performs Read or Write for the SSD 100, the host 1 inputs a logical block addressing (LBA) as a logical address via the ATA I/F 2. As shown in FIG. 6, the LBA is a logical address in which serial numbers from zero are attached to sectors (size: 512 B). In the present embodiment, as management units for the WC 21, the RC 22, the FS 12, the IS 13, and the MS 11, which are the components shown in FIG. 5, a cluster address formed of a bit string equal to or higher in order than a low-order (s+1)th bit of an LBA and a track address formed of a bit string equal to or higher in order than a low-order (s+t+1)th bit of an LBA are defined. In the present embodiment, the size of a track and a logical block is the same. The logical block is a virtual block associated with a plurality of physical blocks on a chip of the NAND memory 10. In the present embodiment, the logical block is associated with physical blocks for the number of parallel channels (in this case, four channels as shown in FIG. 1). In the similar manner, the logical page is associated with physical pages for four channels. The logical block is selected from physical blocks belonging to the same bank for efficiently using the bank interleave.

<Read Cache (RC) 22>

The RC 22 is an area for temporarily storing, in response to a read request from the host 1, Read data from the NAND memory 10 (the FS 12, the IS 13, and the MS 11). Data transfer to the host 1 is basically performed from the RC 22. When data writing is performed from the WC 21 to the NAND memory 10, data on the RC 22 of the same logical address is invalidated.

<Write Cache (WC) 21>

The WC 21 is an area for temporarily storing, in response to a write request from the host 1, Write data from the host 1. Data on the WC 21 is managed in cluster units, and writing and management of valid data are performed in sector units. When a resource of the WC 21 becomes insufficient, data stored on the WC 21 is flushed to the NAND memory 10. When writing is performed in a logical address same as that of data on the RC 22 from the host 1, the latest data is stored on the WC 21. Therefore, when there is data corresponding to the same logical address on the WC 21, the RC 22, and the NAND memory 10, the data is new in the order of the WC 21, the RC 22, and the NAND memory 10, so that the data on the WC 21 is prioritized to be returned to the host 1.

<Main Storage Area (MS) 11>

The MS 11 performs data management in track units, and most user data is stored in the MS 11. A track (high-density track) that has many valid clusters on the WC 21 is directly written from the WC 21 to the MS 11. Moreover, data that cannot be managed by the FS 12 and the IS 13 is input to the MS 11. A track of which LBA is the same as a track input to the MS 11 is invalidated in a logical block, and this logical block is released. A cluster that belongs to the track of which LBA is the same as the track input to the MS 11 is invalidated in FS12, IS13, and a logical block in which all clusters are invalidated is released. The MS 11 consists of a plurality of logical blocks of the MLC mode. In the present embodiment, the size of a track and a logical block is the same, so that additional recording processing performed in the FS 12 or the IS 13 and the compaction (processing for collecting only valid clusters to generate a new logical block and releasing an invalid cluster part) performed in the IS 13 are unnecessary in the MS 11. If the track size is smaller than the logical block size, the additional recording processing performed in the FS 12 and the IS 13 and the compaction performed in the IS 13 can be applied to the MS 11.

<Pre-Stage Storage Area (FS) 12>

The FS 12 is a buffer that adapts a first-in first-out (FIFO) structure in which data is managed in cluster units, and input is performed in units of logical page in which a plurality of clusters is collected. A track (low-density track) with smaller number of valid clusters on the WC 21 is first written in the FS 12. The FS 12 has a FIFO structure in which logical blocks are arranged in the order of data writing. When a cluster of which LBA is the same as a cluster present in the FS 12 is input to the FS 12, it is sufficient to invalidate the cluster in the FS 12, and rewriting is not performed. The cluster of which LBA is the same as the cluster input to the FS 12 is invalidated in a logical block, and a logical block in which all clusters in the logical block are invalidated is released. A cluster stored in a logical block that reaches the end of a FIFO structure of the FS 12 is regarded as a cluster with low possibility of rewriting from the host 1 and the logical block as a whole is relocated to the IS 13 under the management of the IS 13. In the present embodiment, the FS 12 consists of a plurality of logical blocks of the pseudo SLC mode to speed up writing. The FS 12 can consist of a plurality of logical blocks of the MLC mode. Data with a high update frequency is invalidated when passing through the FS 12 and only data with low update frequency overflows from the FS 12, so that the FS 12 can separate data with low update frequency from data with high update frequency. Consequently, it is possible to lower the possibility that the compaction occurs frequently in the IS 13 of a subsequent stage.

<Intermediate Stage Storage Area (IS) 13>

The IS 13 is a buffer for storing a cluster with low possibility of rewriting, and management of data is performed in cluster units in the same manner as the FS 12. When a cluster of which LBA is the same as a cluster present in the IS 13 is input to the FS 12 and the IS 13, it is sufficient to invalidate the cluster in the IS 13, and rewriting is not performed. In the similar manner to the FS 12, the IS 13 has a list structure in which logical blocks are arranged in order from a logical block on which data is written first (from a logical block that is relocated from the FS 12 first); however the IS 13 performs the compaction, which is different from the FS 12. When the capacity of the IS 13 is saturated or management tables for the FS 12 and the IS 13 are saturated, the compaction (collecting valid clusters from the IS 13 and rewriting it to the IS 13) or a defragmentation (integrating clusters of the FS 12 and the IS 13 into a track and flushing it to the MS 11) is performed. In the present embodiment, the IS 13 consists of a mixture of logical blocks of the MLC mode and the pseudo SLC mode. In other words, a block relocated from the FS 12 to the IS 13 is a logical block of the pseudo SLC mode; however, the block is rewritten to a logical block of the MLC mode when performing the compaction in the IS 13. When the FS 12 consists of logical blocks of the MLC mode, the IS 13 also consists of only logical blocks of the MLC mode.

Figure 7:
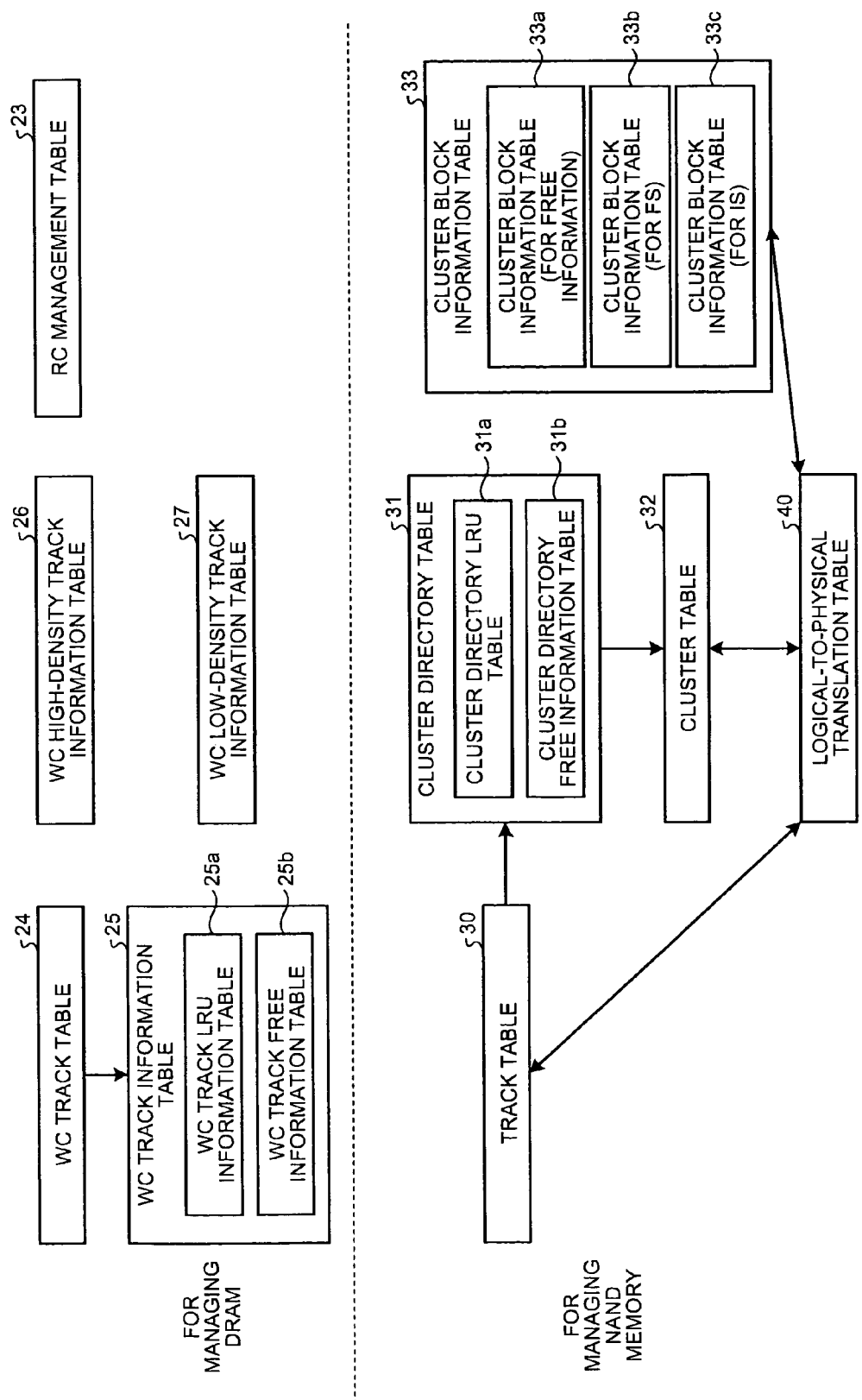
FIG. 7 is a diagram illustrating a configuration example of management tables in a data managing unit.

FIG. 7 is a diagram illustrating management tables for the data managing unit 120 to control and manage the respective components shown in FIG. 5. The table for managing the DRAM 20 includes a RC management table 23, a WC track table 24, a WC track information table 25, a WC high-density track information table 26, and a WC low-density track information table 27. The table for managing the NAND memory 10 includes a track table 30, a cluster directory table 31, a cluster table 32, a cluster block information table 33, and a logical-to-physical translation table 40. The table for managing the NAND memory 10 is classified into a table referred to in a forward lookup address translation and a table referred to in a reverse lookup address translation. The forward lookup address translation is to obtain (logical block address+cluster position) at which data is actually stored from an LBA of the data. The reverse lookup address translation is to obtain an LBA of data from (logical block address+cluster position).

<RC Management Table 23>

The RC management table 23 is for managing data transferred from the NAND memory 10 to the RC 22.

<WC Track Table 24>

The WC track table 24 is a hash table to look up WC track information concerning data stored on the WC 21 from an LBA, and includes a plurality of entries (tags) for each index that is a few bits of least significant bits (LSB) of a track address of an LBA. Each tag stores an LBA track address and a pointer to the WC track information corresponding to the track address.

<WC Track Information Table 25>

The WC track information table 25 includes a WC track least recently used (LRU) information table 25a for managing the time ordering of accessed WC track information by a bi-directional linked list using LRU and a WC track free information table 25b that manages a free WC track information number. When data is flushed from the WC 21 to the NAND memory 10, the oldest accessed track is taken by using the WC track LRU information table 25a.

The WC track information corresponds to one of a plurality of tracks present in the WC 21.

The WC track information includes the followings:

(1) a track address present in the WC 21, the number of valid clusters on the WC 21 in a track, information indicating whether each cluster is valid, and cluster position information in the WC indicating a position of each cluster in the WC 21, (2) information (sector bitmap) indicating a sector that stores valid data among a plurality of sectors included in one cluster, and (3) track status information (e.g., valid, invalid, during data transfer from ATA, and during writing in the NAND memory). In the WC track information, LSB (t) bits of a cluster address present in the own track are managed at a storage position at which a valid cluster is present; however, the method of managing a cluster address is arbitrary. For example, the LSB (t) bits themselves of the cluster address present in the own track can be managed (see FIG. 6).

<WC High-Density Track Information Table 26>

The WC high-density track information table 26 is for managing high-density (the number of valid clusters in a track is equal to or more than a specific percentage) track information to be written in the MS 11 and manages the WC track information concerning a high-density track and the number thereof.

<WC Low-Density Track Information Table 27>

The WC low-density track information table 27 is for managing low-density (the number of valid clusters in a track is less than a specific percentage) track information to be written in the FS 12 and manages the total number of clusters of a low-density track.

<Track Table 30 (Forward Lookup)>

The track table 30 is a table for obtaining track information from a track address of an LBA. The track information includes the followings:

(1) a logical block address (information indicating a logical block in which data of a track is stored), (2) a cluster directory number (information that becomes valid when at least part of data in a track is stored in the FS 12 or the IS 13 and that indicates a table number of a cluster directory table that is present for each track when data in a track is stored in the FS 12 or the IS 13), and (3) the number of FS/IS clusters (information that indicates the number of clusters in a track stored in the FS 12 or the IS 13 and is used for determining whether to perform the defragmentation).

<Cluster Directory Table 31 (Forward Lookup)>

The cluster directory table 31 is an intermediate table for tracing to the logical block when data in a track is stored in the FS 12 or the IS 13. The cluster directory table 31 is provided for each track. Cluster directory information registered in each cluster directory table 31 consists of an array of information (cluster table number information) indicating a table number of the cluster table 32. One piece of information is selected from among a plurality of pieces of the cluster table number information arrayed in one cluster directory table 31 by upper few bits in LSB (t) bits of a cluster address of an LBA.

The cluster directory table 31 includes a cluster directory LRU table 31a for managing the time ordering of the cluster directory information (array of the cluster table number information) together with a corresponding track address with a writing time as a reference by a bi-directional linked list using the LRU and a cluster directory free information table 31b that manages a free cluster directory together with a corresponding track address by a bi-directional linked list.

<Cluster Table 32 (Forward Lookup)>

The cluster table 32 is a table that relates to the cluster directory table 31 and manages a cluster position in a logical block at which data is stored when the data in a track is stored in the FS 12 or the IS 13. The cluster table 32 is referred to from the track table 30 indirectly via the cluster directory table 31. The cluster table 32 is actually an array of (logical block address+cluster position) for a plurality of clusters. One piece of information is selected from among a plurality of pieces of (logical block address+cluster position) arrayed in one cluster table 32 by lower few bits in LSB (t) bits of a cluster address of an LBA. The cluster table 32 also includes a cluster block information number and information about a cluster position therein as an array.

<Cluster Block Information Table 33 (Reverse Lookup)>

A cluster block is a block that stores data in cluster units among logical blocks. Cluster block information is information for managing logical blocks of the FS 12 and the IS 13 and indicates a type of a cluster present in the logical blocks. A plurality of the cluster block information is coupled in the order of FIFO in the FS 12 and the IS 13 as a bi-directional linked list.

The cluster block information includes the followings:

(1) a logical block address, (2) the number of valid clusters, and (3) an LBA of a cluster included in a logical block.

The cluster block information table 33 includes a cluster block information table 33a for managing free information, a cluster block information table 33b for the FS 12, and a cluster block information table 33c for the IS 13. The cluster block information table 33a manages unused cluster block information, the cluster block information table 33b manages the cluster block information included in the FS 12, and the cluster block information table 33c manages the cluster block information included in the IS 13. Each of the cluster block information tables 33a to 33c is managed as a bi-directional linked list. The principal use of the reverse lookup address translation is the compaction of the IS 13. The reverse lookup address translation is used to check a type of a cluster stored in a logical block as a compaction target and rewrite data to a different location. Therefore, in the present embodiment, the reverse lookup address translation targets only the FS 12 and the IS 13 that store data in cluster units.

<Logical-to-Physical Translation Table 40 (Forward Lookup)>

The logical-to-physical translation table 40 is a table for managing information concerning translation between a logical block address and a physical block address and the life. The logical-to-physical translation table 40 includes information indicating a plurality of physical block addresses belonging to a logical block, information indicating the number of times of erasing of a logical block address, and information about a cluster block information number, for each logical block address. For rewriting data of a certain LBA to a different location, an LBA in an original cluster block needs to be invalidated, so that it is needed to trace to a cluster block from the LBA. Therefore, an identifier of the cluster block information is stored in management information of a logical block managed by the logical-to-physical translation table 40.

(Snapshot and Log)

With the management information managed by each management table, an LBA used in the host 1, a logical NAND address (logical block address+offset) used in the SSD 100, and a physical NAND address (physical block address+offset) used in the NAND memory 10 can be associated with each other, so that data exchange between the host 1 and the NAND memory 10 can be performed.

The tables for NAND memory management, such as the track table 30, the cluster directory table 31, the cluster table 32, the cluster block information table 33, and the logical-to-physical translation table 40 shown in FIG. 7, among the above management tables are stored in a specific area of the nonvolatile NAND memory 10. At the time of start-up, each management table stored in the NAND memory 10 is loaded onto a work area of the volatile DRAM 20, which is used by the data managing unit 120, so that each management table is updated. Each management table loaded on the DRAM 20 is called a master table. Even when the power is turned off, a master table needs to be restored to a state before the power is turned off, so that a system of storing the master table in the nonvolatile NAND memory 10 is needed. A snapshot indicates a whole nonvolatile management table on the NAND memory 10. An operation of storing a master table loaded on the DRAM 20 directly in the NAND memory 10 is expressed also as "take a snapshot". A log indicates a change difference of a management table. If a snapshot is taken for every update of a master table, a processing speed becomes slow and the number of times of writing in the NAND memory 10 increases, so that only a log as a change difference is normally recorded in the NAND memory 10. An operation of reflecting a log in a master table and storing it in the NAND memory 10 is expressed also as "commit".

Figure 8:
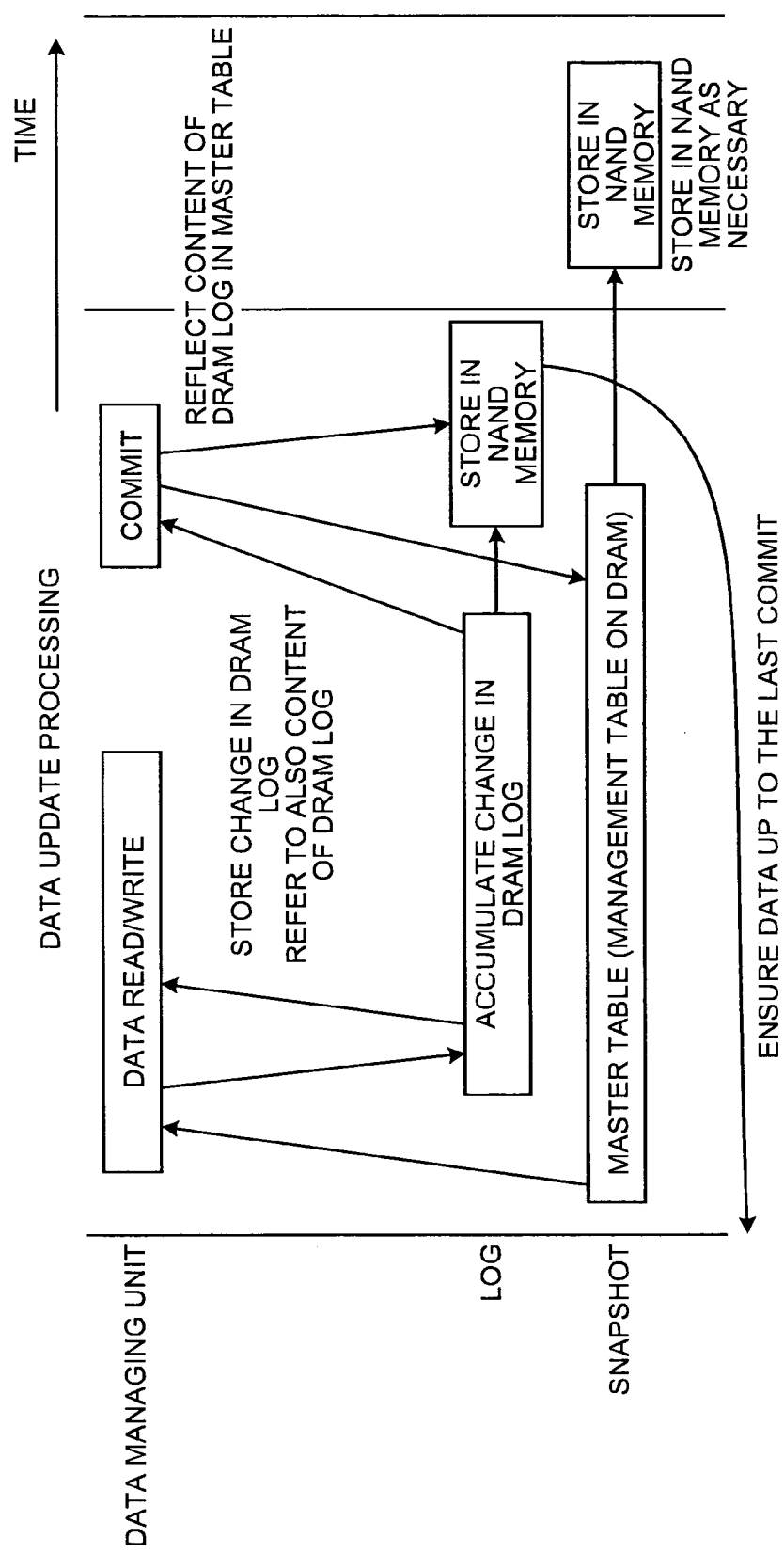
FIG. 8 is a diagram conceptually illustrating a generation state of a snapshot and a log.

FIG. 8 is a diagram illustrating an updating state of a snapshot and a log at the time of data update. When the data managing unit 120 updates data, changes made to a master table are accumulated in a log (hereinafter, "DRAM log") on the DRAM 20. Depending on the type of a management table, a master table is directly updated and an updated content is accumulated in a DRAM log, or an updated content is recorded in a change area secured on the DRAM log without directly changing a master table. When performing data read-out or data writing, the accumulated DRAM log is also referred to in addition to a master table.

After data update becomes stable, a log is committed. In the commit processing, a content of a DRAM log is reflected in a master table as necessary and is further stored in the NAND memory 10 to make it nonvolatile. A snapshot is stored in the NAND memory 10 on occasions such as in a normal power-off sequence and when a storage area for a log becomes insufficient. At the time when writing of a log or a snapshot in the NAND memory 10 is finished, the processing of making a management table nonvolatile is completed. A technology for making the management information nonvolatile in this manner is disclosed, for example, in International Patent Application PCT/JP2009/052597, and the whole content thereof is incorporated in the present application.

<Read Processing>

Read processing is briefly explained. When a read command and an LBA as a readout address are input from the ATA-command processing unit 121, the data managing unit 120 searches through the RC management table 23 and the WC track table 24 to check whether data corresponding to the LBA is present in the WC 21 or the RC 22. In the case of a cache hit, the data managing unit 120 reads out data of the WC 21 or the RC 22 corresponding to the LBA and sends the data to the ATA-command processing unit 121.

If there is no hit in the RC 22 or the WC 21, the data managing unit 120 searches in which part of the NAND memory 10 data as a search target is stored. If the data is stored on the MS 11, the data managing unit 120 traces the LBA→the track table 30→the logical-to-physical translation table 40 to obtain the data on the MS 11. On the other hands, if the data is stored on the FS 12 or the IS 13, the data managing unit 120 traces the LBA→the track table 30→the cluster directory table 31→the cluster table 32→the logical-to-physical translation table 40 to obtain the data on the FS 12 or the IS 13.

<Write Processing>

(Processing in the WC 21)

Figure 9:
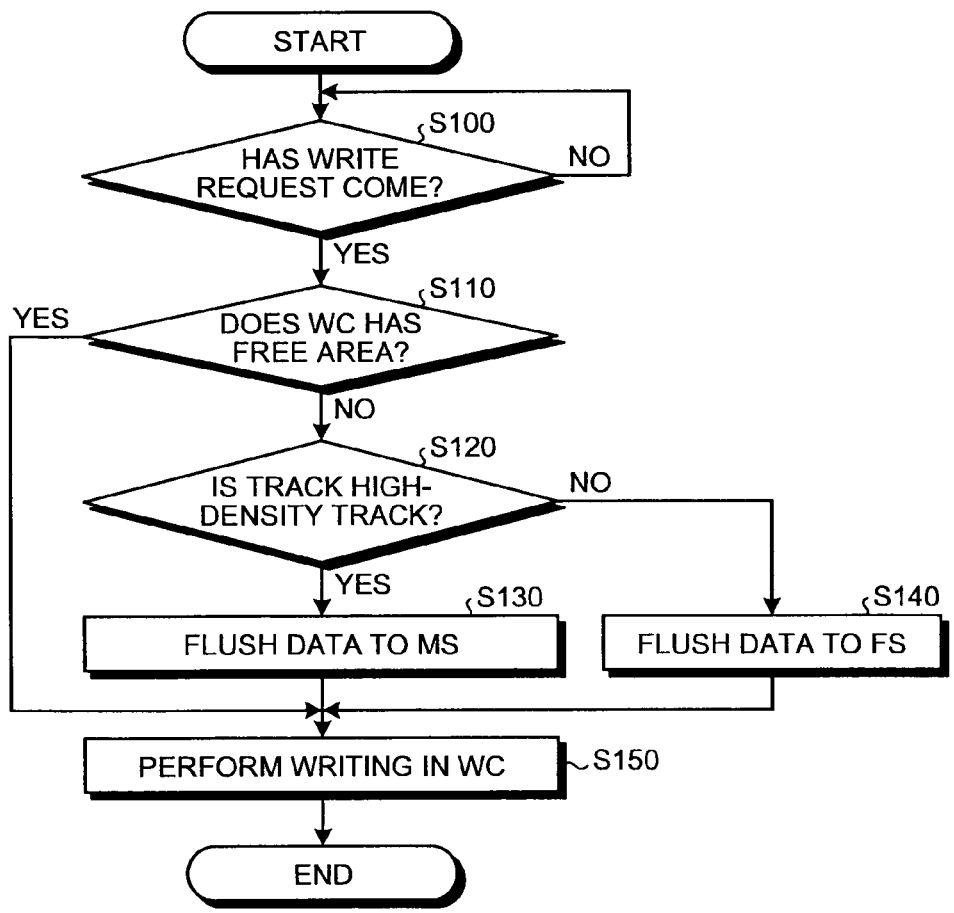
FIG. 9 is a flowchart illustrating write processing in a write cache (WC).

Next, the write processing is briefly explained in accordance with a flowchart shown in FIG. 9. In the write processing, when a write command and an LBA as a write address are input from the ATA-command processing unit 121 (Step S100), the data managing unit 120 writes data specified by the LBA in the WC 21. Specifically, the data managing unit 120 judges whether there is a free area corresponding to the write request in the WC 21 (Step S110), and writes the data specified by the LBA in the WC 21 when there is a free area in the WC 21 (Step S150).

On the other hand, when the WC 21 has no free area corresponding to the write request, the data managing unit 120 flushes data from the WC 21 by referring to various management tables for DRAM management to write it in the NAND memory 10, thereby generating a free area. Specifically, the data managing unit 120 checks the number of valid clusters in tracks (Step S120), determines a track in which the number of valid clusters in the track is less than a specific percentage as a low-density track, and flushes it as cluster size data to the FS 12 as a flush destination (Step S140). When the flush destination is the FS 12, a valid cluster in the track is written in logical page units.

In the judgment at Step S120, when it is judged that the number of valid clusters in a track is equal to or more than the specific percentage, this track is determined as a high-density track and is flushed as track size data to the MS 11 as a flush destination (Step S130). When the flush destination is the MS 11, the data of the track size is directly written in the whole logical block. When there is a plurality of logical blocks as a writing target, the transfer efficiency is improved by using the double speed mode or the bank interleave.

In this manner, after generating a free area in the WC 21, the data specified by the LBA is written in the WC 21 (Step S150). Various management tables for DRAM management are updated in accordance with the data written in the WC 21 or the data flushing to the NAND memory 10.

(Writing from the WC 21 to the MS 11)

Figure 10:
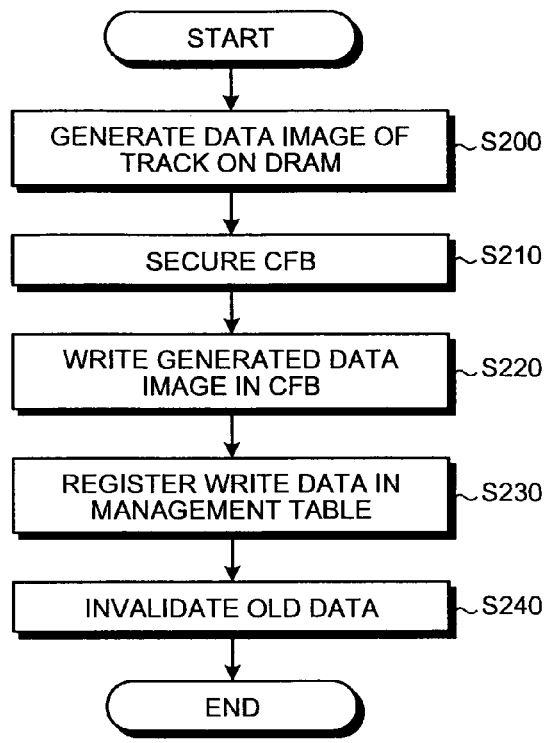
FIG. 10 is a flowchart illustrating an operation procedure of the write processing from the WC to a main storage area (MS).
Figure 11:
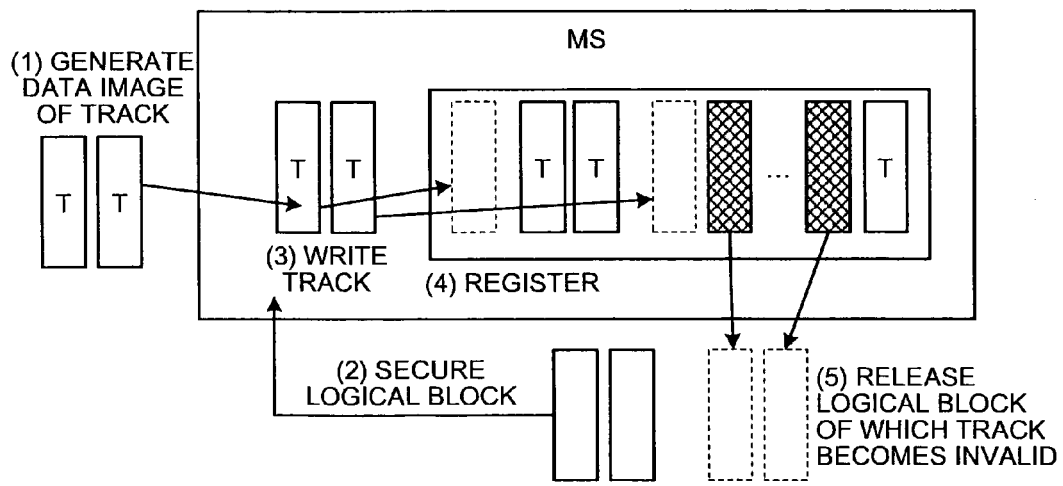
FIG. 11 is a schematic diagram illustrating an operation concept of the write processing from the WC to the MS.

Next, the write processing of a high-density track from the WC 21 to the MS 11 is explained in accordance with FIG. 10 and FIG. 11. FIG. 10 is a flowchart illustrating an operation procedure thereof, and FIG. 11 is a schematic diagram illustrating an operation concept thereof.

Writing to the MS 11 is performed in the following procedures. The data managing unit 120 can select a plurality of high-density tracks to which writing can be performed in parallel by utilizing the bank interleave in addition to the high-density track that is a flush target.

1. The data managing unit 120 generates a data image of a track on the DRAM 20 (padding processing) (Step S200). Specifically, a cluster that is not present in the WC 21 and a cluster that holds not all of the sectors in the WC 21 are read out from the NAND memory 10 to be integrated with data in the WC 21.

2. The data managing unit 120 secures a logical block (track block) from a CFB for the MS 11 (Step S210). The track block is a block that stores therein data in track units among logical blocks.

3. The data managing unit 120 writes the data image of the track generated at Step S200 in the logical block secured at Step 210 (Step S220).

4. The data managing unit 120 checks the track information from an LBA of the track, associates the track information with a logical block address corresponding to the written logical block, and registers it in a required table for NAND memory management (Step S230).

5. The data managing unit 120 invalidates old data in the WC 21 and the NAND memory 10 (Step S240). Specifically, the data managing unit 120 causes cache data in the WC 21 flushed to the MS 11 and data in the NAND memory 10 used in the padding processing at Step S200 to be an invalid state from a valid state on a management table to invalidate them.

(Writing from the WC 21 to the FS 12)

Figure 12:
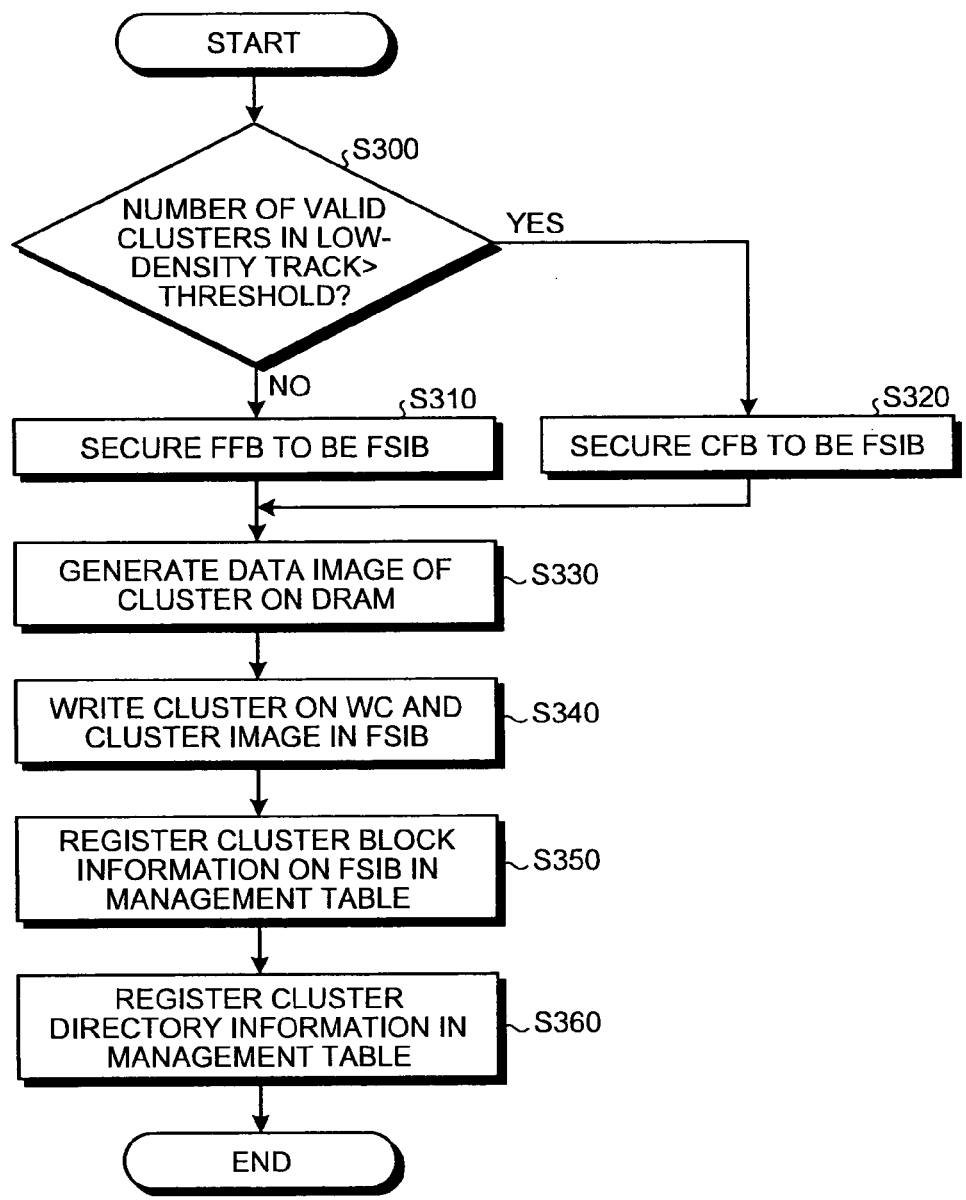
FIG. 12 is a flowchart illustrating an operation procedure of the write processing of a low density track from the WC to a pre-stage storage area (FS).
Figure 13:
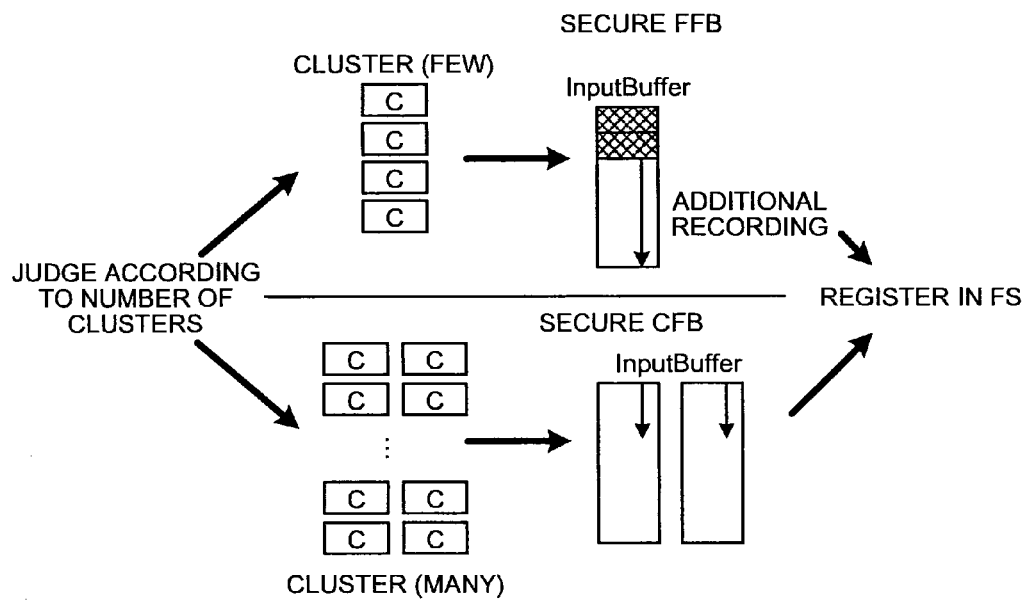
FIG. 13 is a schematic diagram illustrating an operation concept of the write processing of a low density track from the WC to the FS.

Next, the write processing of a low-density track from the WC 21 to the FS 12 is explained in accordance with FIG. 12 and FIG. 13. FIG. 12 is a flowchart illustrating an operation procedure thereof, and FIG. 13 is a schematic diagram illustrating an operation concept thereof.

Writing to the FS 12 is performed by generating a data image of a cluster on the DRAM 20 (padding processing) and performing writing in logical page units in a newly-secured logical block (cluster block) by using the pseudo SLC mode. As the logical block to be secured, an FFB having a logical page capable of writing equal to or more than a data image to be written is prioritized. If an FFB is not present, a CFB is used. The writing in the FS 12 is performed in the following procedures.

A logical block (cluster block) for writing data of a low-density track from the WC 21 to the FS 12 is called an FS input buffer (FSIB). The data managing unit 120 can involve other low-density tracks so that a cluster data amount to be written coincides with a logical block boundary of the pseudo SLC mode in addition to the low-density track that is a flush target.

1. The data managing unit 120 judges a total data amount in the low-density track input from the WC 21 (Step S300). When the judged total data amount is small, i.e., when the number of valid clusters is smaller than a specific threshold, the data managing unit 120 secures an FFB in which the data can be written to be an FSIB (Step S310).

2. When the data managing unit 120 judges that the total data amount in the low-density track input from the WC 21 is large, i.e., when the number of valid clusters is equal to or larger than the specific threshold, the data managing unit 120 secures a CFB to be an FSIB (Step S320). At this time, a plurality of logical blocks capable of writing data in parallel is secured to be an FSIB.

3. The data managing unit 120 generates a data image of a cluster to be written on the DRAM 20 (Step S330). Specifically, for a cluster that holds not all of sectors in the WC 21, the data managing unit 120 reads out data of a sector that is not present on the WC 21 from the NAND memory 10 to be integrated with the data of the sectors on the WC 21.

4. The data managing unit 120 writes the cluster on the WC 21 and the cluster image generated on the work area in the FSIB (Step S340).

5. The data managing unit 120 adds the cluster block information on this FSIB to the cluster block information table 33b for the FS (Step S350).

6. The data managing unit 120 reinserts the cluster directory information on the low-density track written in the FSIB into the end of the cluster directory LRU table 31a together with a corresponding track address (Step S360).

(Relocation from the FS 12 to the IS 13)

Figure 14:
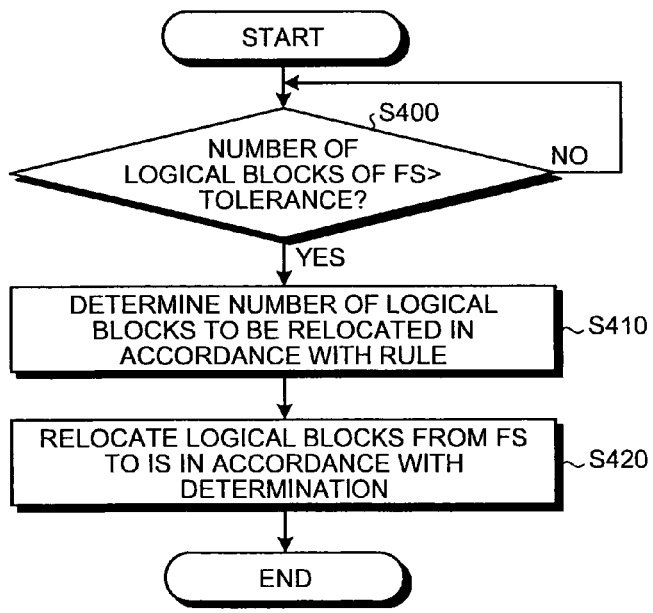
FIG. 14 is a flowchart illustrating an operation procedure of data relocation from the FS to an intermediate stage storage area (IS).
Figure 15:
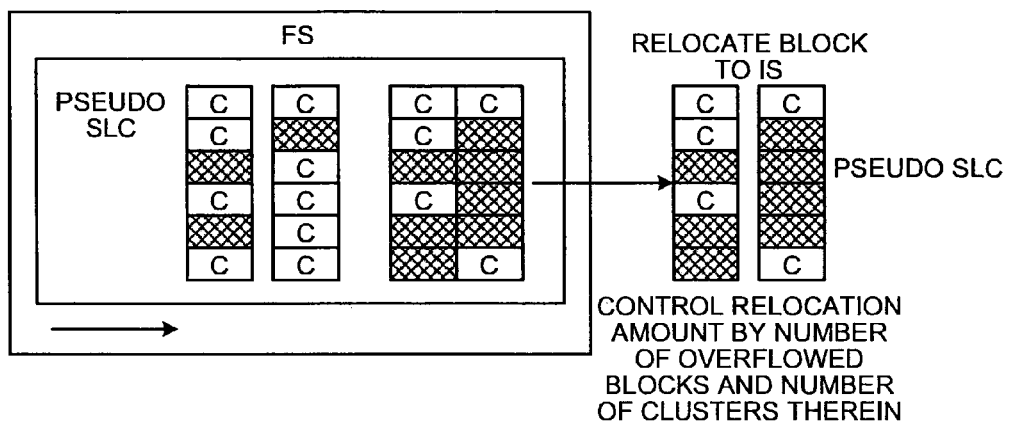
FIG. 15 is a schematic diagram illustrating an operation concept of the data relocation from the FS to the IS.

Next, data relocation from the FS 12 to the IS 13 is explained in accordance with FIG. 14 and FIG. 15. FIG. 14 is a flowchart illustrating an operation procedure thereof, and FIG. 15 is a schematic diagram illustrating an operation concept thereof.

The data managing unit 120 judges whether the number of logical blocks under the management of the FS 12 exceeds a specific maximum number of logical blocks (Step S400). When the number of logical blocks under the management of the FS 12 exceeds the specific maximum number of logical blocks, as shown in FIG. 15, the data managing unit 120 relocates a logical block that is overflowed from the FS 12 directly to the IS 13. In the present embodiment, the FS 12 consists of a plurality of logical blocks of the pseudo SLC mode, and a logical block of the pseudo SLC mode is directly relocated from the FS 12 to the IS 13. The number of logical blocks to be relocated in one process unit is determined by the following rule in accordance with the number of valid clusters in the overflowed logical block and the like (Step S410).

A logical block that is relocated is added from the oldest logical block of the FS 12 so that the total number of clusters in the overflowed logical block becomes close to the boundary of one logical block of the MLC mode, i.e., close to the number ($2^t$) of clusters for one logical block or a multiple ($m \times 2^t$: m is a natural number) thereof. For example, when the number of clusters in the overflowed logical block is a value between $2^t$ and $2^{t+1}$, the number of logical blocks as a relocation target is increased so that the number of clusters is close to $2^{t+1}$ (including $2^{t+1}$). The number of clusters is caused to be close to the boundary of one logical block of the MLC mode to accommodate valid clusters as many as possible in a logical block after the compaction.

When the number of clusters exceeds the number of clusters z that can be subjected to the compaction simultaneously in the IS 13, the number of logical blocks is set so that the number of clusters is equal to or smaller than this number of clusters z.

The upper limit is set to the number of logical blocks to be relocated in one processing. This limitation is set for preventing temporary increase of the number of logical blocks under the management of the IS 13.

The logical blocks as a relocation target determined in this manner are relocated from the FS 12 to the IS 13 (Step S420).

(Compaction and Defragmentation in the IS 13)

Figure 16:
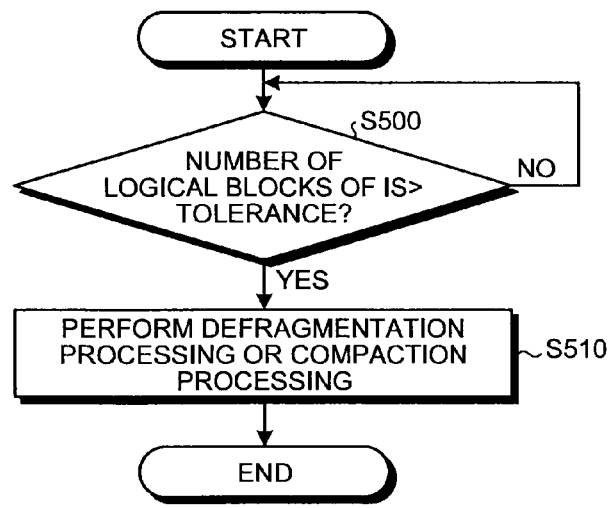
FIG. 16 is a flowchart illustrating an operation procedure of defragmentation processing and compaction processing in the IS.

Next, the compaction processing and the defragmentation processing in the IS 13 are explained in accordance with a flowchart shown in FIG. 16.

The data managing unit 120 judges whether the number of logical blocks under the management of the IS 13 exceeds a specific maximum number of logical blocks (Step S500). When the number of logical blocks under the management of the IS 13 exceeds the maximum number of logical blocks, the data managing unit 120 performs data relocation (defragmentation processing) to the MS 11 and the compaction processing to suppress the number of logical blocks under the management of the IS 13 to be equal to or less than the maximum number of logical blocks (Step S510). When a data erasing unit (logical block) and a data management unit (cluster) are different, according to the progress of rewriting of the NAND memory 10, logical blocks are made porous by invalid data. When the logical blocks in such a porous state increase, substantially usable logical blocks decrease and a storage area of the NAND memory 10 cannot be effectively used. Therefore, processing called compaction for collecting valid clusters and rewriting it in a different logical block is performed. The defragmentation processing is processing of integrating clusters of the FS 12 and the IS 13 into a track and flushing it to the MS 11.

Subsequently, the essential part of this embodiment is explained more in detail. In the above SSD, the WC 21 is provided on the DRAM 20 as a random-accessible high-speed memory and data is written in the NAND memory 10 after temporarily storing the data in the WC 21 because it takes time for writing of the NAND memory 10, there is a limitation in the number of times of writing, a unit of a writing size is fixed, and the like. Moreover, as described above, for data in the WC 21, switching control of a storing unit is performed to write large data (high-density track) to the MS 11 and write small data (low-density track) to the FS 12 for reducing the number of times of writing (the number of times of erasing) to the NAND memory 10.

Moreover, when data is written in the NAND memory 10 and the resource (such as a capacity and the number of entries of a management table) in each storing unit becomes insufficient, the organizing of the NAND memory 10 such as the compaction and the defragmentation is performed to secure the resource of each storing unit. In the similar manner, for the WC 21, when the resource (such as a data storage area and the number of entries of a management table) exceeds the limitation, as described above, data is flushed to the NAND memory 10 to secure the resource of the WC 21. The condition used often as the flush condition at this time is the condition of securing a free resource in the WC 21 sufficient for the next writing from the host 1. In this condition, the response to a single write command is improved by enabling to always receive writing from the host 1 to the WC 21; however, when the organizing of the NAND memory 10 does not proceed and it takes time for writing to the NAND memory 10, the response to the subsequent write command is lowered.

Therefore, in the present embodiment, a threshold (an auto flush (AF) threshold) is set for performing flushing from the WC 21 to the NAND memory 10 early. When the organizing (such as the compaction and the defragmentation) in the NAND memory 10 has proceeded sufficiently, the organizing in the NAND memory 10 is started early by flushing data from the WC 21 to the NAND memory 10 early, whereby the subsequent flushing from the WC 21 can be performed at high speed. Consequently, many resources (such as a memory area and an entry of a management table) of the WC 21 can be secured, so that the response to the subsequent write command is improved.

The flush processing in the WC 21 is explained in detail below. First, the management structure of the WC 21 is explained in more detail with reference to FIG. 17. In the present embodiment, as shown in FIG. 1, each of the parallel operation elements 10*a* to 10*d* of the NAND memory 10 includes four banks (Bank0 to Bank3) capable of performing the bank interleave. Each memory chip includes two planes of the plane 0 and the plane 1 capable of performing the parallel operation.

Figure 17:
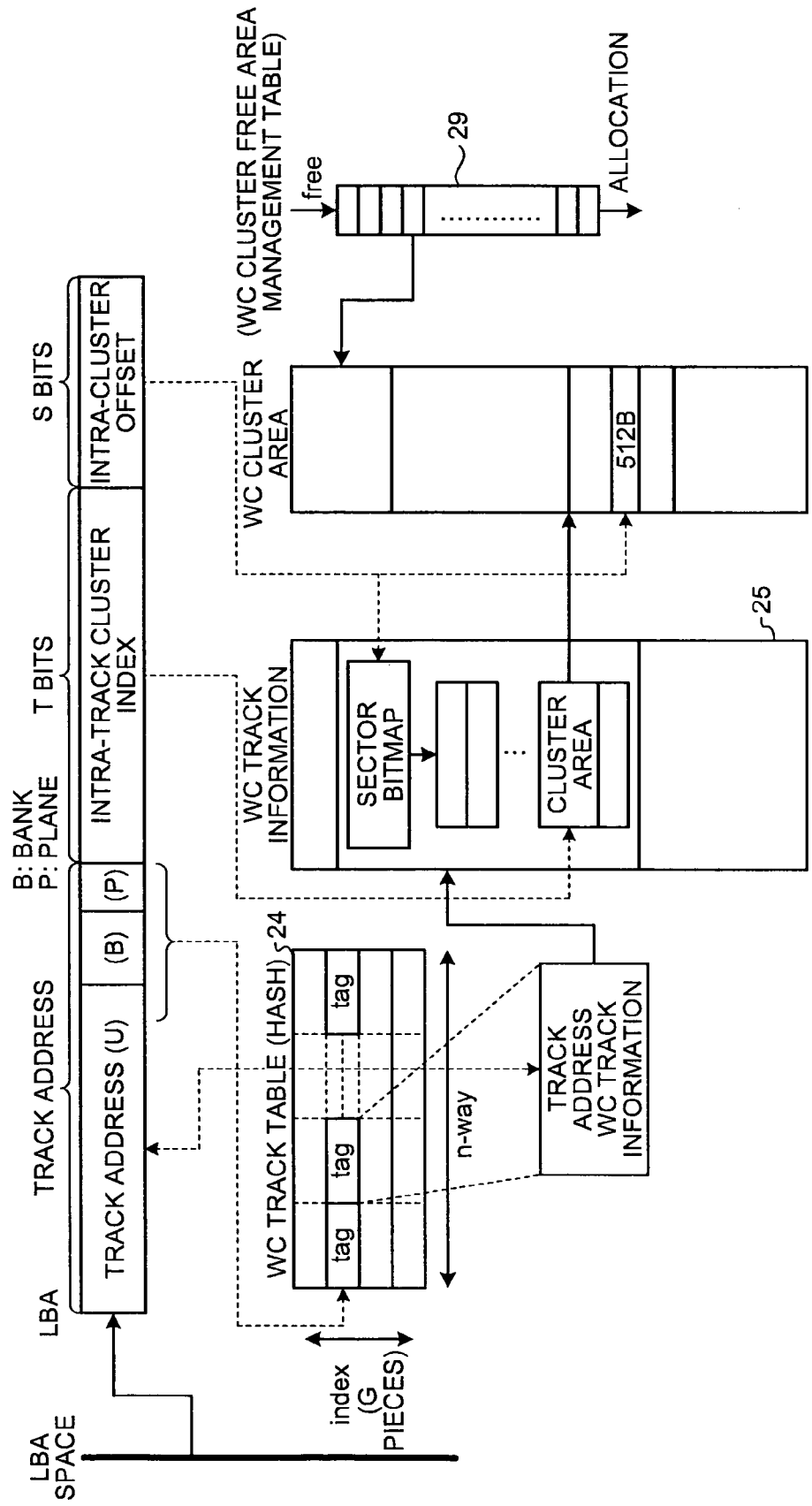
FIG. 17 is a diagram illustrating a management structure in the WC.

In the present embodiment, allocation of bank/plane of the NAND memory 10 to an LBA is performed as shown in FIG. 17. Specifically, a plane (P) is allocated to a first bit of LSB of a track address of an LBA, and a bank (B) is allocated to second and third bits of the LSB of the track address of the LBA. When each bank is configured with two chips, a chip (C) is allocated to a fourth bit of the LSB.

It goes without saying that the number of bits allocated to the plane (P), the number of bits allocated to the bank (B), and the number of bits allocated to the chip (C) in the track address of the LBA are not limited thereto, and can be appropriately changed in accordance with the number of the planes, the banks, and the chips in the NAND memory 10.

In the present embodiment, the plane/bank/chip allocation to such track address of the LBA is used only in writing to the MS 11 in the NAND memory 10. In this case, parallel writing can be maximally utilized in sequential writing of large size data.

In writing to the FS 12 and the IS 13, the plane/bank/chip allocation to a track address of an LBA may be performed in the similar manner, or the plane/bank/chip allocation to a track address of an LBA may not be performed to any of the FS 12, the IS 13, and the MS 11. When the plane/bank/chip allocation to a track address of an LBA is not performed, the allocation is dynamically performed in accordance with a usage status of a logical block.

As described above, the WC track table 24 is, for example, a hash table to look up the WC track information concerning data stored on the WC 21 from an LBA, and includes n (way) pieces of entries (tags) for each of g pieces of indexes each of which is a few bits of LSB including the plane/bank allocation bits (P,B) of a track address of an LBA. Each tag stores therein a track address of an LBA and a pointer to the WC track information corresponding to the track address. Therefore, (g×n) pieces of different tracks can be cached in the WC 21. The number of free entries (or the number of used entries) α1 for each index of the WC track table 24 is counted corresponding to update of the WC track table 24, and these number of free entries α1 become one parameter (WC resource usage) to trigger flushing of the WC 21.

Figure 18:
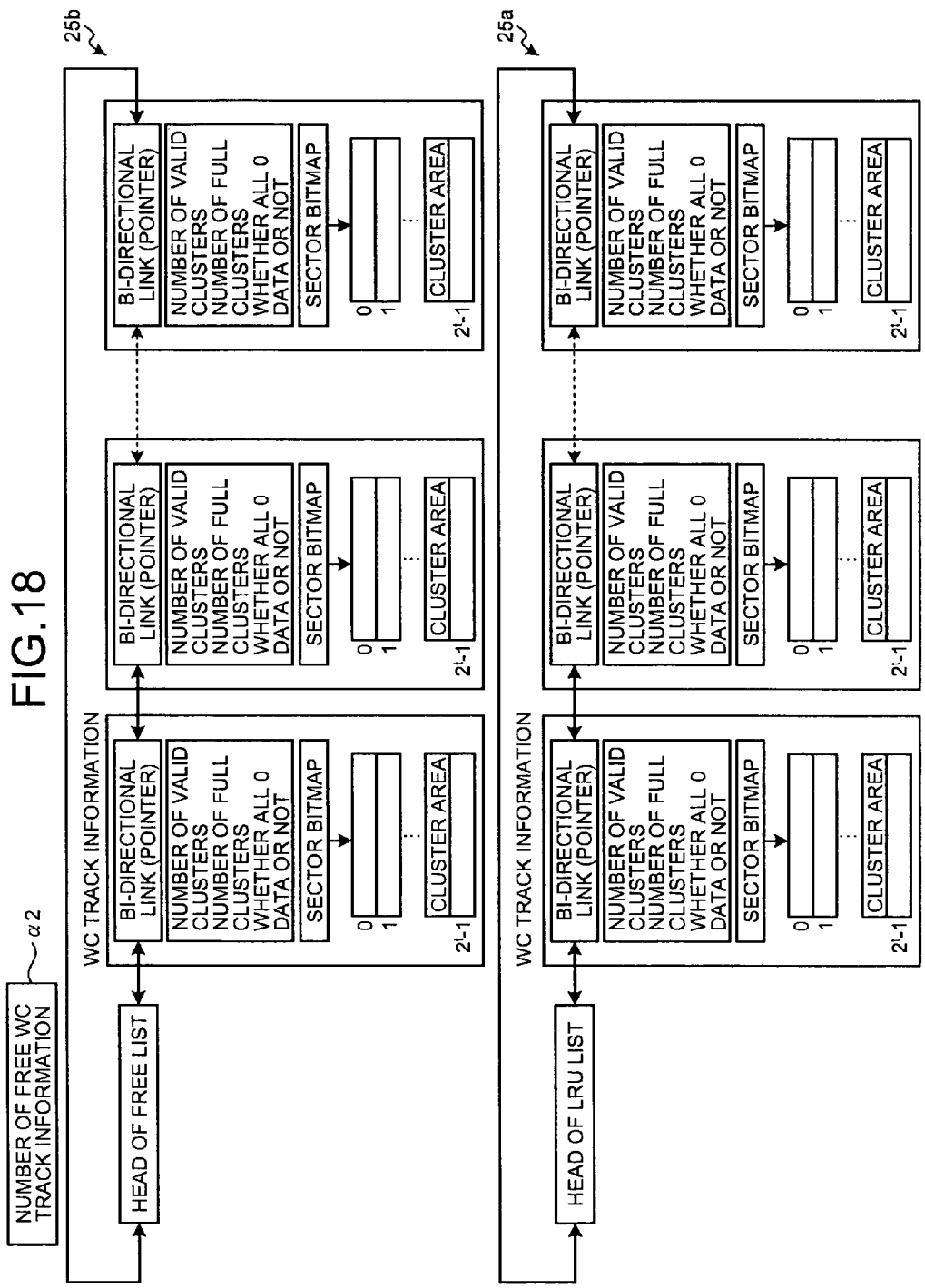
FIG. 18 is a diagram illustrating a WC track information table.

As shown in FIG. 18, the WC track information table 25 includes the WC track LRU information table 25*a* for managing the WC track information, for example, by a bi-directional linked list using LRU and the WC track free information table 25*b* that manages free WC track information, for example, as the bi-directional linked list.

As described above, the WC track information includes the followings:

(1) information indicating the number of valid clusters in a track present in the WC 21 and information indicating the number of full clusters (the number of clusters each of which is full of sector data), (2) information (sector bitmap) that is generated based on an intra-cluster offset that is a few bits (s bits) on an LSB side of an LBA and indicates a sector that stores therein valid data among a plurality of sectors included in one cluster, (3) track state information (e.g., valid, invalid, during data transfer from ATA, and during writing in the NAND memory), (4) information for identifying whether all-zero data is included in track units, and (5) cluster position information: (as shown in FIG. 17 and FIG. 18, ($2^t-1$) pieces of cluster areas with a cluster area number corresponding to an intra-track cluster index (t bits) of an LBA as an index are secured and cluster position information indicating the position in the WC 21 at which the cluster data is present is stored in each cluster area. In the cluster area of the cluster area number corresponding to a free cluster, an invalid value is stored.)

In the WC 21, as described above, up to (g×n) pieces of different tracks can be cached in the WC 21, and information on a track used in the WC 21 is managed by the WC track LRU information table 25a. On the other hand, the WC track free information table 25b manages free WC track information with respect to the maximum number of tracks (g×n) capable of being cached in the WC 21. When the number of the WC track information registered in the WC track LRU information table 25a is d, the WC track free information table 25b manages ((g×n)−d) pieces of free WC track information. The WC track information prepared for the WC track free information table 25b is for securing an area of the WC track information used in the WC track LRU information table 25a in the WC 21 and stores various information shown in FIG. 18 when starting managing a new track. In other words, when new track information needs to be managed in the WC 21, one piece of the track information is secured from the WC track free information table 25b and required information is stored in the secured WC track information to be reconnected to the link of the WC track LRU information table 25a. Information such as a track address corresponding to newly secured WC track information and the like are registered in the WC track table 24 and are also registered in the WC high-density track information table 26 shown in FIG. 19 in the case of a high-density track.

Every time new WC track information is secured from the WC track free information table 25b (every time one list of the WC track information is removed from the WC track free information table 25b shown in FIG. 18), the number of free WC track information α2 indicating the number of free WC track information in the WC 21 shown in FIG. 18 is decremented by one (−1), and every time the WC track information registered in the WC track LRU information table 25a is released and returned to the WC track free information table 25b due to occurrence of flushing to the NAND memory 10 from the WC 21 or the like, the number of free WC track information α2 is incremented by one (+1). It goes without saying that the number of the WC track information used in the WC 21 can be managed instead of the number of free WC track information α2. The number of free WC track information α2 (or the number of the WC track information used in the WC 21) becomes one parameter (WC resource usage) to trigger flushing of the WC 21.

A WC cluster area management table 29 shown in FIG. 17 is for managing a free cluster area in each track and manages a free cluster area number by a FIFO structure, a bi-directional linked list, or the like. Moreover, the total number of free cluster areas is managed by the WC cluster area management table 29. The maximum value of the number of used cluster areas corresponds to a cache capacity of the WC 21. For example, in the case of the WC 21 of 32 MB, the maximum value of the number of used cluster areas is the number of clusters corresponding to 32 MB. The case when the total number of free cluster areas is 0 corresponds to the maximum value of the number of used cluster areas. The total number of free cluster areas (or used cluster areas) α3 becomes one parameter (WC resource usage) to trigger flushing of the WC 21.

Figure 19:
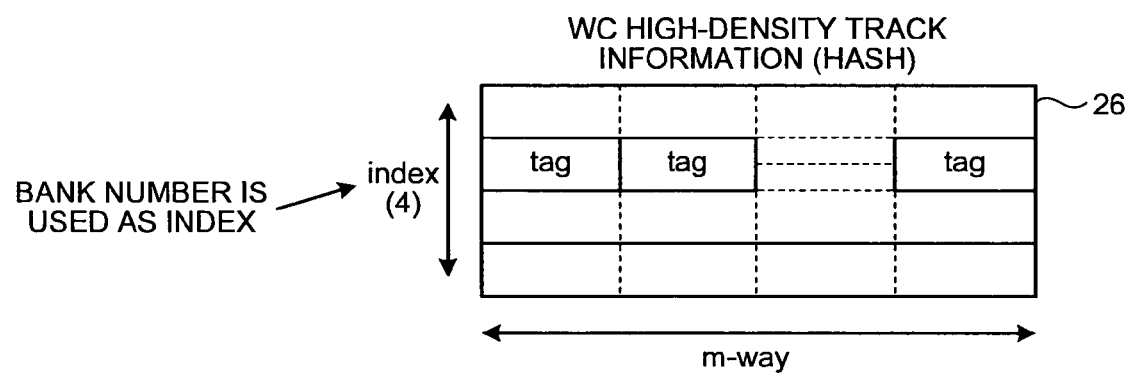
FIG. 19 is a diagram illustrating a WC high-density track information table.

FIG. 19 illustrates the WC high-density track information table 26. The WC high-density track information table 26 is a hash table to manage the track information on a high-density track having a large number of valid clusters to be written in the MS 11 with a bank number (B) of a track address of an LBA as an index, and includes m pieces of entries (ways) for each index. A high-density track on the WC 21 is managed for each bank to which writing can be surely performed in parallel, so that the time required for a track searching when performing flushing from the WC 21 to the MS 11 can be shortened. Moreover, the number of tracks to be written in the MS 11 is regulated to up to the value m in each bank by the WC high-density track information table 26, so that the maximum flush time from the WC 21 to the NAND memory 10 can be suppressed. In the same index in the WC high-density track information table 26, there may be tracks (planes 0 and 1) to which writing can be performed in the double speed mode. The number of high-density track information is managed for each bank number by counting the number of entries in the WC high-density track information table 26. The number of the high-density track information α4 for each bank becomes one parameter (WC resource usage) to trigger flushing of the WC 21.

The WC low-density track information table 27 (see FIG. 7) is for managing low-density track information to be written in the FS 12, and manages the sum value of the number of clusters of a low-density track. The sum value α5 of the number of clusters of a low-density track becomes one parameter (WC resource usage) to trigger flushing of the WC 21.

FIG. 20 is a diagram illustrating a relationship between a plurality of parameters (WC resource usages) to trigger flushing of the WC 21 and two thresholds (an AF threshold Caf and an upper limit Clmt). As shown in FIG. 20, as described above, the parameters to trigger flushing of the WC 21 include the followings:

The WC cluster area (total number of free cluster areas) α3

The number of the high-density track information α4 for each bank (the number of tracks α4 to the MS)

The sum value α5 of the number of clusters of a low-density track (the number of clusters α5 to the FS or the cluster data amount α5 to the FS)

The number of the WC track information (the number of free WC track information) α2

The number of used entries (or the number of free entries) α1 for each index of the WC track table The number of full tracks α6

The parameters α1 to α6 to trigger flushing of the WC 21 are also called a WC resource usage.

The number of full tracks α6 is the number of tracks each of which is full of sectors and clusters. In other words, the full track is a track in which the number of full clusters in the WC track information becomes $2^t$ that is the number of the cluster area numbers. The data managing unit 120 includes a dedicated counter (not shown) for counting the number of full tracks.

In each of the parameters α1 to α6, two thresholds (the AF threshold Caf and the upper limit Clmt) for the flush processing of the WC 21 are set. In FIG. 20, a maximum value max set for each of the parameters α1 to α6 indicates the substantially maximum value that each of the parameters α1 to α6 can take, and basically does not have a meaning as a threshold to trigger flushing of the WC 21.

The upper limit Clmt is a threshold indicating a possibility that the next write request cannot be received when the parameters α1 to α6 become equal to or more than this value. In the case of exceeding the upper limit Clmt, a write request from the host 1 may be kept waiting. Therefore, the upper limit Clmt can be regarded as a threshold to keep the next write request from the host 1 waiting. If the organizing of the NAND memory 10 is finished while keeping the next write request waiting because any of the parameters α1 to α6 exceeds the upper limit Clmt, data is flushed from the WC 21 to the NAND memory 10 to cause the parameter to be equal to or less than the upper limit Clmt. When all of the parameters α1 to α6 become equal to or less than the upper limit Clmt, the next write request from the host 1 is received. If the organizing of the NAND memory 10 is not finished while keeping the next write request waiting because any of the parameters α1 to α6 exceeds the upper limit Clmt, the organizing of the NAND memory 10 is prioritized and the flushing to the NAND memory 10 is not performed. After finishing the organizing of the NAND memory 10, data is flushed from the WC 21 to the NAND memory 10 to cause the parameter to be equal to or less than the upper limit Clmt. Thereafter, the next write request from the host 1 is received.

The AF threshold Caf is a threshold for performing auto flush processing. The auto flush processing is performed regardless of a flush command from the host 1 and is processing of flushing part or all of data of the WC 21 to the NAND memory 10 by the judgment of the data managing unit 120 according to the status. The auto flush processing is processing that is performed after finishing a write command from the host 1 and for totally improving the writing performance by generating a certain free space in the WC 21 in advance. When any of the parameters α1 to α6 becomes equal to or more than the AF threshold Caf, the auto flush processing is performed to flush data from the WC 21 to the NAND memory 10 early. Therefore, typically, the relationship of AF threshold Caf<upper limit Clmt<maximum value max is satisfied. When any of the parameters α1 to α6 exceeds the AF threshold Caf, the organizing state of the NAND memory 10 is checked, and the auto flush processing is performed when the organizing of the NAND memory 10 is finished. Even when any of the parameters α1 to α6 exceeds the AF threshold Caf, if the organizing of the NAND memory 10 is not finished, the organizing of the NAND memory 10 is prioritized because the WC 21 is still not the state where a write request from the host 1 cannot to be kept waiting.

Next, the maximum value max, the upper limit Clmt, and the AF threshold Caf are explained for each of the parameters α1 to α6.

A value Z that is the maximum value max of the WC cluster area (the total number of free cluster areas) α3 is a capacity of the WC 21. When the WC 21 has a capacity of 32 MB, Z=32 MB. The AF threshold Caf of the WC cluster area (the total number of free cluster areas) α3 is, for example, set to Z/2 that is a half of the maximum value max. The upper limit Clmt of the α3 is determined considering a single data transfer size from the host 1. For example, the upper limit Clmt of the α3 is set to about ⅞ to 15/16 of the value Z.

The maximum value max of the number of the WC track information α2 is the total number of entries of the WC track table 24, and is (g×n) in this case. The AF threshold Caf of the α2 is, for example, set to (g×n)/2 that is a half of the maximum value max. The upper limit Clmt of the number of the WC track information α2 can be set to an appropriate value that is smaller than (g×n) and larger than (g×n)/2 although it is not set in FIG. 20.

The maximum value max of the number of used entries α1 for each index of the WC track table is a value n (see FIG. 17). The AF threshold Caf of the α1 can be, for example, set to about n/2 that is a half of the maximum value max although it is not set in FIG. 20. The upper limit Clmt of the α1 is set to one remaining (state in which only the last entry (way) of the WC track table 24 remains).

For the number of full tracks α6, only the AF threshold Caf (=y) is set. Even if the number of full tracks α6 increases, if other parameters are free, it is possible to respond to the next write request from the host, so that the upper limit Clmt of the number of full tracks α6 is not set.

Next, the maximum value max of the number of tracks α4 (for each bank) to the MS is a value m that is the number of entries (ways) of the WC high-density track information table 26 shown in FIG. 19. The numerical value m is determined considering the time required for processing a flush command as an instruction of flushing all data of the WC 21 to the NAND memory 10. Moreover, a maximum value Q of the number of clusters α5 to the FS (cluster data amount α5 to the FS) is the maximum value of the sum value of the number of clusters (or the cluster data amount) of a low-density track to be flushed to the FS 12. The numerical value Q is also determined considering the time required for processing a flush command, the resource usage on the side of the NAND memory 10 (suppressing the increase of the number of blocks for the FS 12 and the IS 13 and a management table amount for the FS 12 and the IS 13 by suppressing writing to the FS 12), and the like. When executing a flush command, a high-density track needs to be flushed to the MS 11 and a low-density track needs to be flushed to the FS 12.

As described above, the track size is equal to the logical block size in the present embodiment. The logical block is a virtual block constituted by combining a plurality of physical blocks on a chip of the NAND memory 10. In the present embodiment, the logical block is a unit of causing each physical block in the four parallel operation elements 10a to 10d shown in FIG. 1 to perform the 4-ch parallel operation once. In the WC high-density track information table 26 shown in FIG. 19, one track address is registered in one entry of one bank, and flushing of one track of one bank corresponds to writing one logical block in the NAND memory 10 (in the MS 11 to be exact because the track is a high-density track) once.

On the other hand, in this embodiment, the FS 12 operates in the pseudo SLC mode, and the logical block size in the FS 12 is a half of the logical block size in the MS 11 that operates in the quaternary MLC mode. However, writing in the pseudo SLC mode is several times faster than the MLC mode.

A time Tfl required for the flush command processing is a total of a time Ta required for flushing a high-density track to the MS 11, a time Tb required for flushing a low-density track to the FS 12, and a time Tc (fixed value) required for other processing such as the write processing of log. In other words, the relationship Tfl=Ta+Tb+Tc is satisfied. The time Ta required for flushing a high-density track to the MS 11 is 4×(time required for a single writing (fixed value))×(the number of times of writing (u1)) assuming the case of using the bank interleave with four banks. The time Tb required for flushing a low-density track to the FS 12 is (time for required a single writing (fixed value))×(the number of times of writing (u2)). For suppressing the time Tfl required for the flush command processing to be within a specific worst (maximum) time Tflmax (fixed value) required for the flush command processing, the number of times of writing u1 and u2 can be obtained by the following equation (in this case, for example, u1=u2):

$$Tflmax(\text{fixed value}) = Ta(=4\times(\text{time required for a single writing(fixed value)})\times(\text{the number of times of writing}(u1))) + Tb(=(\text{time required for a single writing (fixed value)})\times(\text{the number of times of writing }(u2))) + Tc(\text{fixed value})$$

The u1 obtained in this manner is the value m as the maximum value max of the number of tracks α4 (for each bank) to the MS. The number of ways m of the WC high-density track information table 26 is determined in this manner. Moreover, because the number of times of writing u2 to the FS 12 that satisfies the worst time Tflmax with respect to the flush command processing is also determined, the value Q (MB) as the maximum value max of the cluster data amount α5 to the FS can be obtained by obtaining the value ((a single writing size of a logical block to the FS 12)×(the number of times of writing u2)).

The AF threshold Caf of the number of tracks α4 (for each bank) to the MS is, for example, set to m/2 that is a half of the maximum value m. When the AF threshold Caf of the α4 is set to m/2, the parallel processing in a double-buffering manner of writing, while writing four tracks to the MS 11, remaining four tracks from the host 1 to the WC 21 can be performed in the auto flush processing. The upper limit Clmt of the α4 is, for example, set to about ⅝ to ⅞ of the value m. The upper limit Clmt is set considering an amount capable of receiving the next write request without flushing data to the NAND memory 10 by keeping a remaining area from the maximum value max, i.e., a single data transfer size from the host device.

The AF threshold Caf of the number of clusters α5 to the FS (the cluster data amount α5 to the FS) is, for example, set to about Q/4 that is ¼ of the maximum value Q. For example, the Q/4 is a value with which the speed similar to the writing speed from the host 1 to the WC 21 can be obtained if writing is performed in the FS 12 in parallel. The upper limit Clmt of the α5 is, for example, set to about ⅝ to ⅞ of the value Q. In the similar manner to the α4, the upper limit Clmt of the α5 is set considering an amount capable of receiving the next write request without flushing data to the NAND memory 10 by keeping a remaining area from the maximum value max, i.e., a single data transfer size from the host device.

Figure 21:
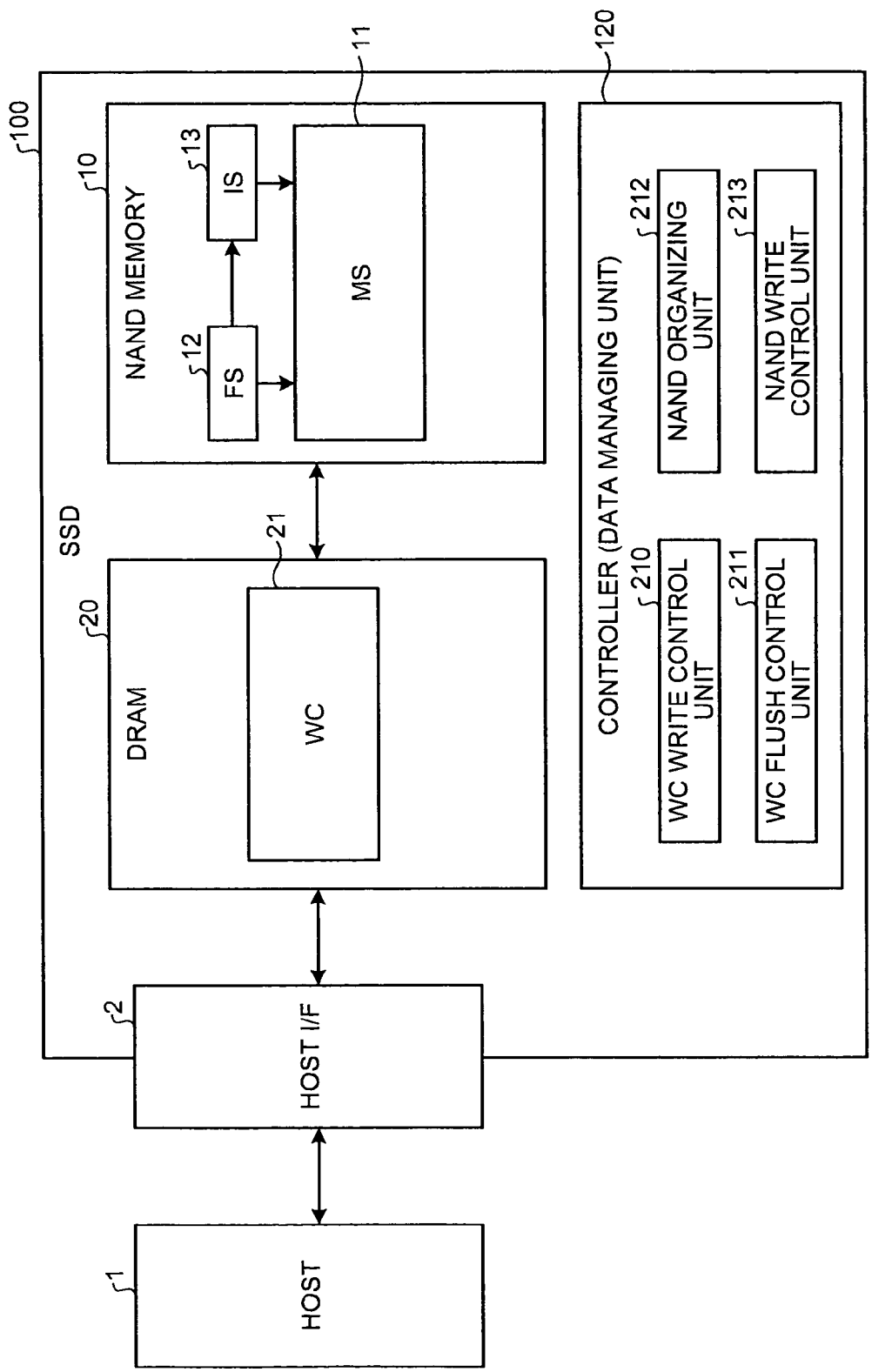
FIG. 21 is a functional block diagram illustrating a configuration of an essential part according to a present embodiment.

FIG. 21 is a block diagram illustrating functional configuration of an essential part according to the present embodiment. As described above, the NAND memory 10 includes the user data storing unit that includes the MS 11, the FS 12, and the IS 13 that store therein user data. The WC 21 is included in the DRAM 20. The controller 120 as the data managing unit includes a WC write control unit 210 that performs control of writing data from the host 1 to the WC 21, a WC flush control unit 211 that performs control of flushing data from the WC 21 to the NAND memory 10, a NAND write control unit 213 that performs control of writing data flushed from the WC 21 to the NAND memory 10, and a NAND organizing unit 212 that performs the organizing (such as the compaction, the defragmentation, the data relocation from the FS 12 to the IS 13) of logical blocks in the NAND memory 10. The NAND organizing unit 212 sequentially sends a NAND organizing state signal (signal indicating whether the organizing processing is currently in execution or finished) indicating a state of the organizing processing in the NAND memory 10 to the WC write control unit 210 and the WC flush control unit 211. The WC write control unit 210 and the WC flush control unit 211 judge the block organizing state in the NAND memory 10 based on the NAND organizing state signal.

(Organizing of NAND Memory)

The organizing of the NAND memory 10 performed by the NAND organizing unit 212 is explained. The organizing of the NAND memory 10 includes the compaction/defragmentation processing for causing the number of logical blocks under the management of the IS 13 to be equal to or less than a specific threshold, the defragmentation processing for causing the number of entries of the NAND management tables (such as the cluster directory table 31 and the cluster table 32) to be equal to or less than a specific threshold, and the data relocation from the FS 12 to the IS 13.

The parameters to be considered when organizing the NAND memory 10, such as the number of logical blocks under the management of the IS 13 and the number of entries of the NAND management tables, are collectively called a NAND resource usage. When each NAND resource usage exceeds a threshold, the NAND organizing unit 212 performs the organizing of the NAND memory 10 and sends the NAND organizing state signal indicating that the processing is in execution to the WC write control unit 210 and the WC flush control unit 211.

(Compaction)

The compaction processing is processing performed in the IS 13. In the compaction processing, when the number of logical blocks under the management of the IS 13 exceeds a specific threshold, latest valid cluster data is collected to be rewritten in a different logical block and an invalid cluster is released. In the present embodiment, because the track size is the same as the logical block size, the compaction does not occur in the MS 11; however, if the track size is different from the logical block size, the compaction occurs even in the MS 11. In this case, the organizing of the NAND memory 10 including the compaction in the MS 11 needs to be performed.

(Defragmentation)

The defragmentation processing is processing of selecting valid clusters in the IS 13 to integrate them into a track and flushing it to the MS 11 when the number of logical blocks under the management of the IS 13 exceeds a specific threshold (maximum number of logical blocks) or when the number of entries of tables for managing the FS 12 and the IS 13, such as the cluster directory table 31 and the cluster table 32, exceeds a specific threshold. When integrating valid clusters in the IS 13 into a track, valid data in the FS 12 and the MS 11 included in the same track is read out onto the DRAM 20 and generates a data image of the track.

Next, the write processing in the WC 21 including flushing to the NAND memory 10 is explained. In the WC 21, data on the WC 21 is flushed to the NAND memory 10 so that all of the resource usages of the WC 21 are always equal to or less than the upper limit Clmt except for the case where the resource usage temporarily exceeds the upper limit Clmt by a write command. Moreover, flushing is continued until the WC resource usages become equal to or less than the AF threshold value Caf except for the case of keeping a request from the host 1 waiting. Specifically, control as described below is performed.

(In a Case where WC Resource Usage>Upper Limit Clmt)

Figure 22:
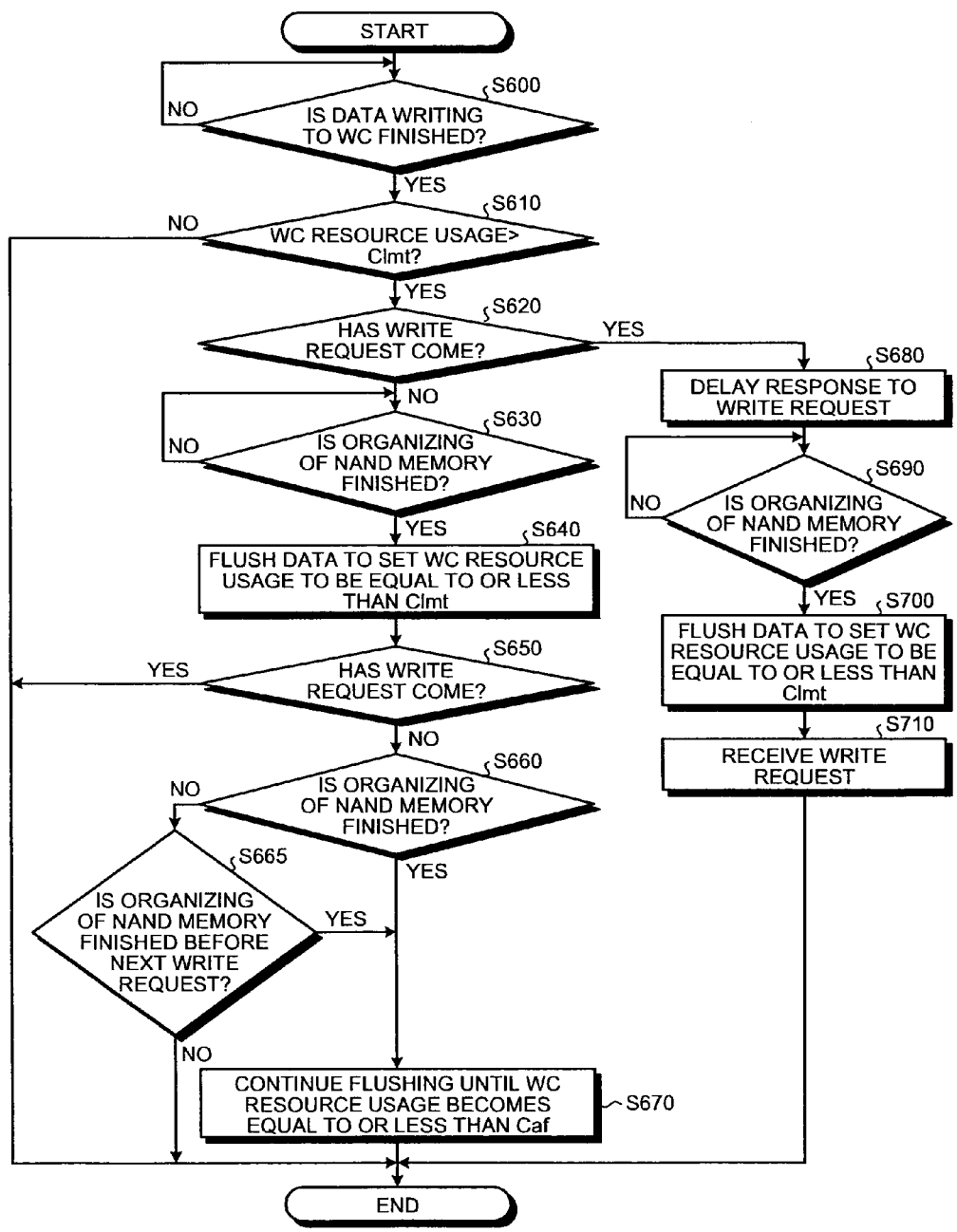
FIG. 22 is a flowchart illustrating an operation procedure when a WC resource usage exceeds the upper limit.

First, processing when the WC resource usage exceeds the upper limit Clmt after finishing data writing from the host 1 to the WC 21 is explained with reference to a flowchart shown in FIG. 22. After finishing the data writing from the host 1 (Step S600), the WC flush control unit 211 judges the state of the WC resource usages α1 to α6. When any of the WC resource usages α1 to α6 exceeds the upper limit Clmt (Yes at Step S610) and the next write request has not come yet from the host 1 (No at Step S620), the processing as described below is performed. The WC flush control unit 211 checks the organizing state of the NAND memory 10 by the NAND organizing state signal (Step S630). When the organizing of the NAND memory 10 is finished, the WC flush control unit 211 flushes data of the WC 21 as a factor contributing to the exceeding of the upper limit Clmt to any or both of the MS 11 and the FS 12 to set all of the WC resource usages α1 to α6 to be equal to or less than the upper limit Clmt (Step S640). A track as a flush target is determined, for example, by preferentially selecting from the oldest track in order by the LRU or selecting a flushing track while prioritizing a processing speed for suppressing the WC resource usage to be equal to or less than upper limit Clmt.

At the time when all of the WC resource usages α1 to α6 become equal to or less than the upper limit Clmt, the WC flush control unit 211 judges whether the next write request has come from the host 1 (Step S650). When the next write request has not come yet from the host 1, the WC flush control unit 211 continues flushing until the WC resource usages α1 to α6 become equal to or less than the AF threshold Caf. Specifically, the WC flush control unit 211 checks the organizing state of the NAND memory 10 by the NAND organizing state signal (Step S660). When the organizing of the NAND memory 10 is finished, the WC flush control unit 211 flushes data of the WC 21 as a factor contributing to the exceeding of the AF threshold Caf to any or both of the MS 11 and the FS 12 to set all of the WC resource usages α1 to α6 to be equal to or less the AF threshold Caf (Step S670). A track as a flush target is determined, for example, by preferentially flushing a full track with high writing efficiency or preferentially selecting from the oldest track in order by the LRU.

On the other hand, at the time when all of the WC resource usages α1 to α6 become equal to or less than the upper limit Clmt, when the next write request has come from the host 1 (Yes at Step S650) or when the WC flush control unit 211 judges that the organizing of the NAND memory 10 is not finished by the NAND organizing state signal (No at Step S660), the WC flush control unit 211 prioritizes the request from the host 1 or the organizing of the NAND memory 10 and does not perform the auto flush processing. When it is confirmed that the organizing of the NAND memory 10 is finished by the NAND organizing state signal before receiving the next write command from the host 1 (Step S665), the auto flush processing is performed (Step S670).

Moreover, after finishing the data writing from the host 1, when any of the WC resource usages α1 to α6 exceeds the upper limit Clmt and the next write request has come from the host 1 (Yes at Step S620), the WC flush control unit 211 performs the processing as described below. The WC flush control unit 211 keeps the next write request from the host 1 waiting (Step S680) and checks the organizing state of the NAND memory 10 by the NAND organizing state signal (Step S690). When the organizing of the NAND memory 10 is finished, the WC flush control unit 211 flushes data of the WC 21 as a factor contributing to the exceeding of the upper limit Clmt to any or both of the MS 11 and the FS 12 to set all of the WC resource usages α1 to α6 to be equal to or less the upper limit Clmt (Step S700). Then, at the time when all of the WC resource usages α1 to α6 become equal to or less than the upper limit Clmt, the WC flush control unit 211 receives a write request from the host 1 (Step S710). However, when the WC flush control unit 211 judges that the organizing of the NAND memory 10 is not finished by the NAND organizing state signal while keeping the next write request from the host 1 waiting (No at Step S690), the WC flush control unit 211 prioritizes the organizing of the NAND memory 10 and is on standby until the organizing of the NAND memory 10 is finished. When the WC flush control unit 211 confirms that the organizing of the NAND memory 10 is finished, the WC flush control unit 211 flushes data of the WC 21 as a factor contributing to the exceeding of the upper limit Clmt to any or both of the MS 11 and the FS 12 to set all of the WC resource usages α1 to α6 to be equal to or less the upper limit Clmt (Step S700). Then, at the time when all of the WC resource usages α1 to α6 become equal to or less than the upper limit Clmt, the WC flush control unit 211 receives a write request from the host 1 (Step S710).

(In a Case where AF Threshold Caf<WC Resource Usage<Upper Limit Clmt)

Figure 23:
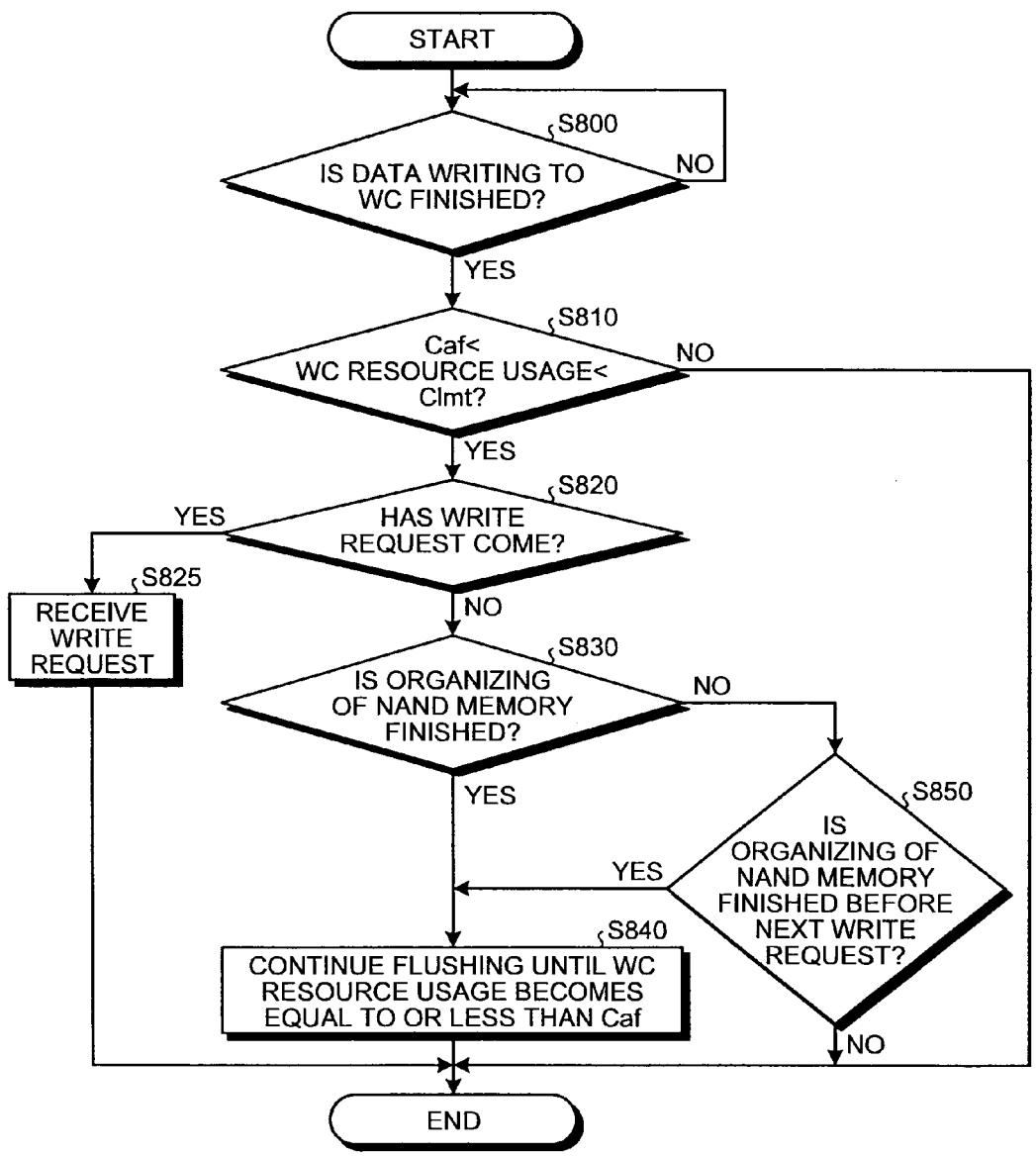
FIG. 23 is a flowchart illustrating an operation procedure when AF threshold<WC resource usage<upper limit.

Next, processing when the WC resource usage does not exceed the upper limit Clmt but exceeds the AF threshold Caf after finishing data writing from the host 1 to the WC 21 is explained in accordance with a flowchart shown in FIG. 23. After finishing the data writing from the host 1 (Step S800), in the case where any of the WC resource usages α1 to α6 exceeds the AF threshold Caf (Step S810), when the next write request has come from the host 1 (Step S820), the WC flush control unit 211 does not perform the auto flush processing and receives the next write request from the host 1 (Step S825).

However, when the next write request has not come yet from the host 1, the processing as described below is performed. The WC flush control unit 211 checks the organizing state of the NAND memory 10 by the NAND organizing state signal (Step S830). When the organizing of the NAND memory 10 is finished, the WC flush control unit 211 flushes data of the WC 21 as a factor contributing to the exceeding of the AF threshold Caf to any or both of the MS 11 and the FS 12 to set all of the WC resource usages α1 to α6 to be equal to or less the AF threshold Caf (Step S840). A track as a flush target is determined, for example, by preferentially flushing a full track with high writing efficiency or preferentially selecting from the oldest track in order by the LRU.

On the other hand, when the WC flush control unit 211 judges that the organizing of the NAND memory 10 is not finished by the NAND organizing state signal even when any of the WC resource usages α1 to α6 exceeds the AF threshold Caf (No at Step S830), the WC flush control unit 211 prioritizes the organizing of the NAND memory 10 and does not perform the auto flush processing. When it is confirmed that the organizing of the NAND memory 10 is finished by the NAND organizing state signal before receiving the next write request from the host 1 (Step S850), the auto flush processing is performed (Step S840). In this manner, when the organizing of the NAND memory 10 is finished after writing, the auto flush processing is performed, so that a free area can be kept early in advance in the WC 21.

Another Embodiment

In the above, first, when the WC resource usages α1 to α6 exceed the upper limit Clmt, the next write request has come from the host 1, and the organizing of the NAND memory 10 is not finished after finishing data writing from the host 1 to the WC 21, the organizing of the NAND memory 10 is performed while keeping the next write request waiting and the flush processing is performed after finishing the organizing of the NAND memory 10; however, control as described below can be performed.

Figure 24:
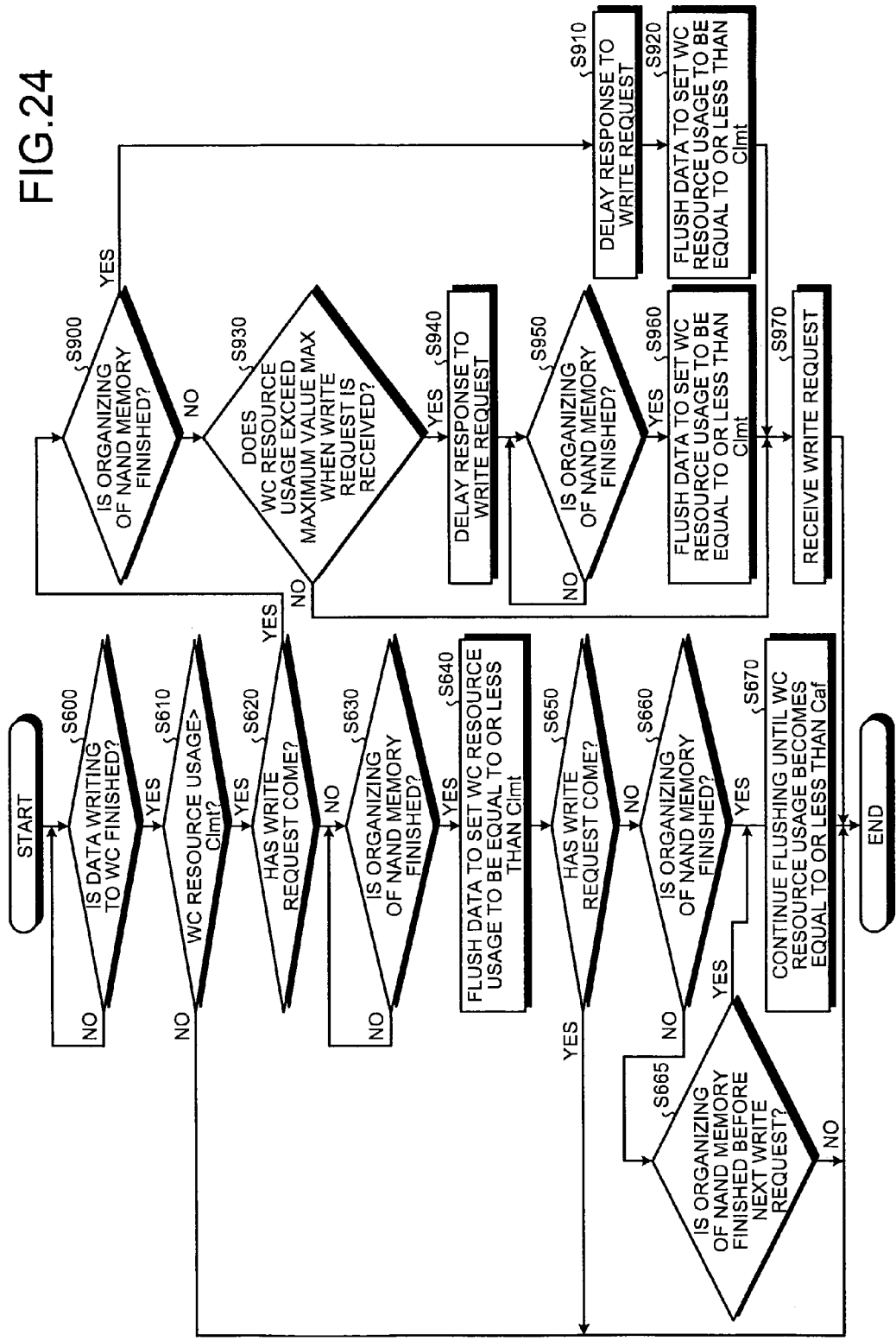
FIG. 24 is a flowchart illustrating another operation procedure when the WC resource usage exceeds the upper limit.

FIG. 24 is a flowchart illustrating another embodiment of processing when the WC resource usage exceeds the upper limit Clmt after data writing from the host 1 to the WC 21. In FIG. 24, Steps S680 to S710 of FIG. 22 are replaced by Steps S900 to S970, and Steps S600 to S670 are common between FIG. 22 and FIG. 24.

In other words, when the above conditions (after data writing from the host 1 to the WC 21 is finished (Step S600), when the WC resource usages $\alpha 1$ to $\alpha 6$ exceed the upper limit Clmt (Step S610), the next write request has come from the host 1 (Step S620), and the organizing of the NAND memory 10 is not finished (Step S900)) are satisfied, it is judged whether the WC resource usages $\alpha 1$ to $\alpha 6$ exceed the maximum value max when the next write request from the host 1 is received (Step S930). Then, when the WC resource usages $\alpha 1$ to $\alpha 6$ do not exceed the maximum value max even when the next write request from the host 1 is received, the next write request from the host 1 is received without flushing data of the WC 21 to the NAND memory 10 (Step S970) and the data is caused to be written in the WC 21.

On the other hand, when it is judged at Step S930 that the WC resource usages $\alpha 1$ to $\alpha 6$ exceed the maximum value max, the next write request from the host 1 is kept waiting (Step S940) and the flush processing is performed so that all of the WC resource usages $\alpha 1$ to $\alpha 6$ become equal to or less than the upper limit Clmt (Step S960) after organizing the NAND memory 10 (Step S950). Thereafter, the next write request from the host 1 is received (Step S970) and the data is caused to be written in the WC 21.

At Step S900, when the organizing of the NAND memory 10 is finished, the next write request from the host 1 is kept waiting (Step S910) and the flush processing is performed so that all of the WC resource usages $\alpha 1$ to $\alpha 6$ become equal to or less than the upper limit Clmt (Step S920). Thereafter, the next write request from the host 1 is received (Step S970) and the data is caused to be written in the WC 21.

In the present embodiment, after data writing from the host 1 to the WC 21, i.e., before writing of data, flushing from the WC 21 to the NAND memory 10 is performed; however, the data writing to the WC 21 and the flushing to the NAND memory 10 can be performed in parallel.

In this manner, according to the present embodiment, the WC resource usage is compared with the AF threshold Caf that is smaller than the upper limit Clmt, and when the WC resource usage exceeds the AF threshold Caf, the organizing state of the NAND memory 10 is checked. When the organizing of the NAND memory 10 has proceeded sufficiently, the time is efficiently utilized to flush data from the WC 21 to the NAND memory 10 early, so that the organizing of the NAND memory 10 can be started early, and thereby enabling to also perform the subsequent flushing from the WC 21 at high speed. Consequently, many resources (such as a memory area and an entry of a management table) of the WC 21 can be secured, so that the response to the subsequent write command can be improved and thus the response to a write request from the host can be generally improved. Moreover, in the present embodiment, a plurality of the WC resource usages $\alpha 1$ to $\alpha 6$ is prepared, and the upper limit Clmt and the AF threshold Caf are prepared for each of the WC resource usages $\alpha 1$ to $\alpha 6$. When any of the WC resource usages $\alpha 1$ to $\alpha 6$ exceeds the upper limit Clmt or the AF threshold Caf corresponding thereto, data as a factor contributing to the exceeding of the upper limit Clmt or the AF threshold Caf is flushed, so that the flush processing when causing the WC resource usage to be equal to or less than the upper limit Clmt or the AF threshold Caf can be performed efficiently and at high speed.

Second Embodiment

Figure 25:
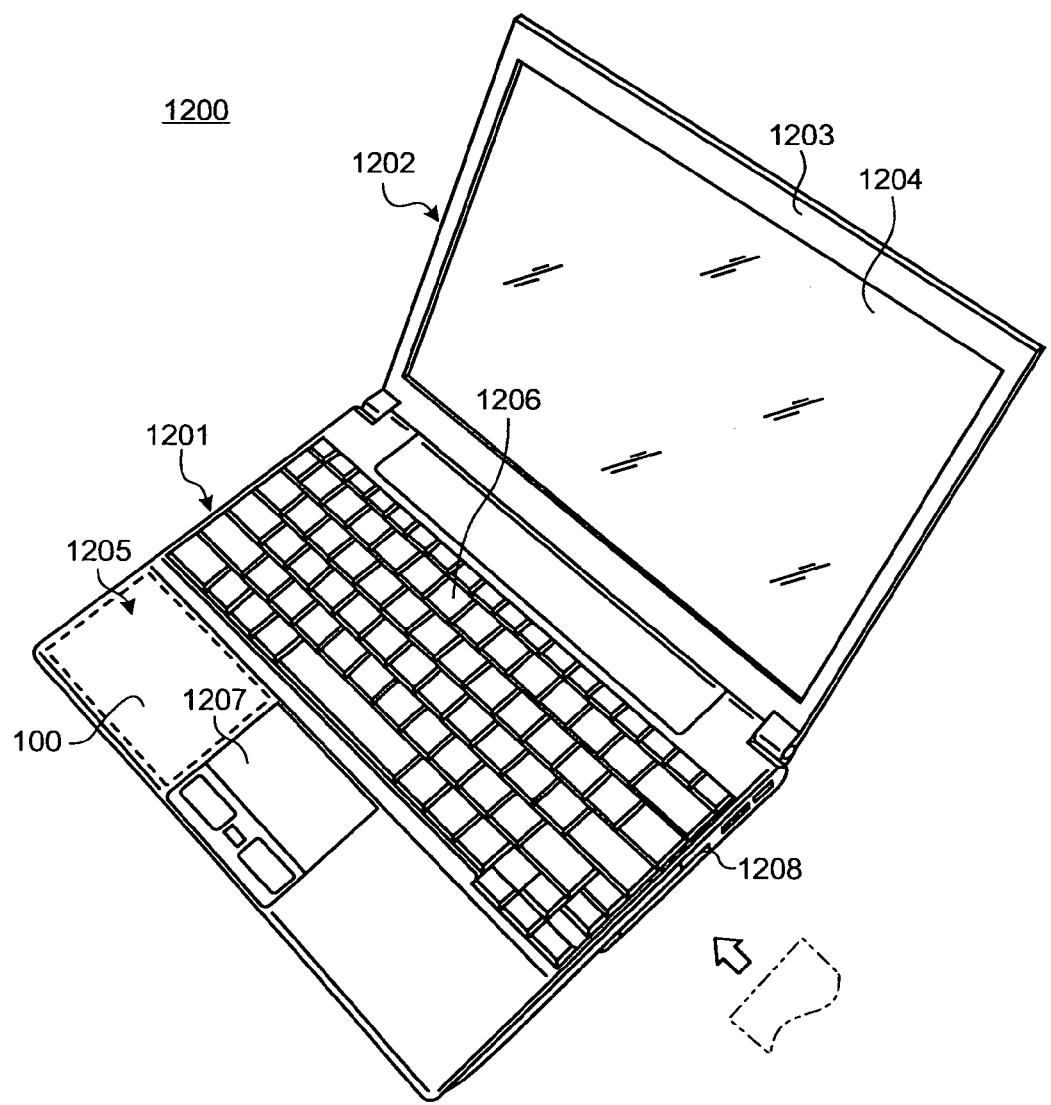
FIG. 25 is an overall view of a PC on which an SSD is mounted.

FIG. 25 is a perspective view of an example of a PC 1200 on which the SSD 100 is mounted. The PC 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes therein a main circuit board, an optical disk device (ODD) unit, a card slot, and the SSD 100.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 100 can be used instead of a conventional hard disk drive (HDD) in the state of being mounted on the PC 1200 or can be used as an additional device in the state of being inserted into the card slot included in the PC 1200.

Figure 26:
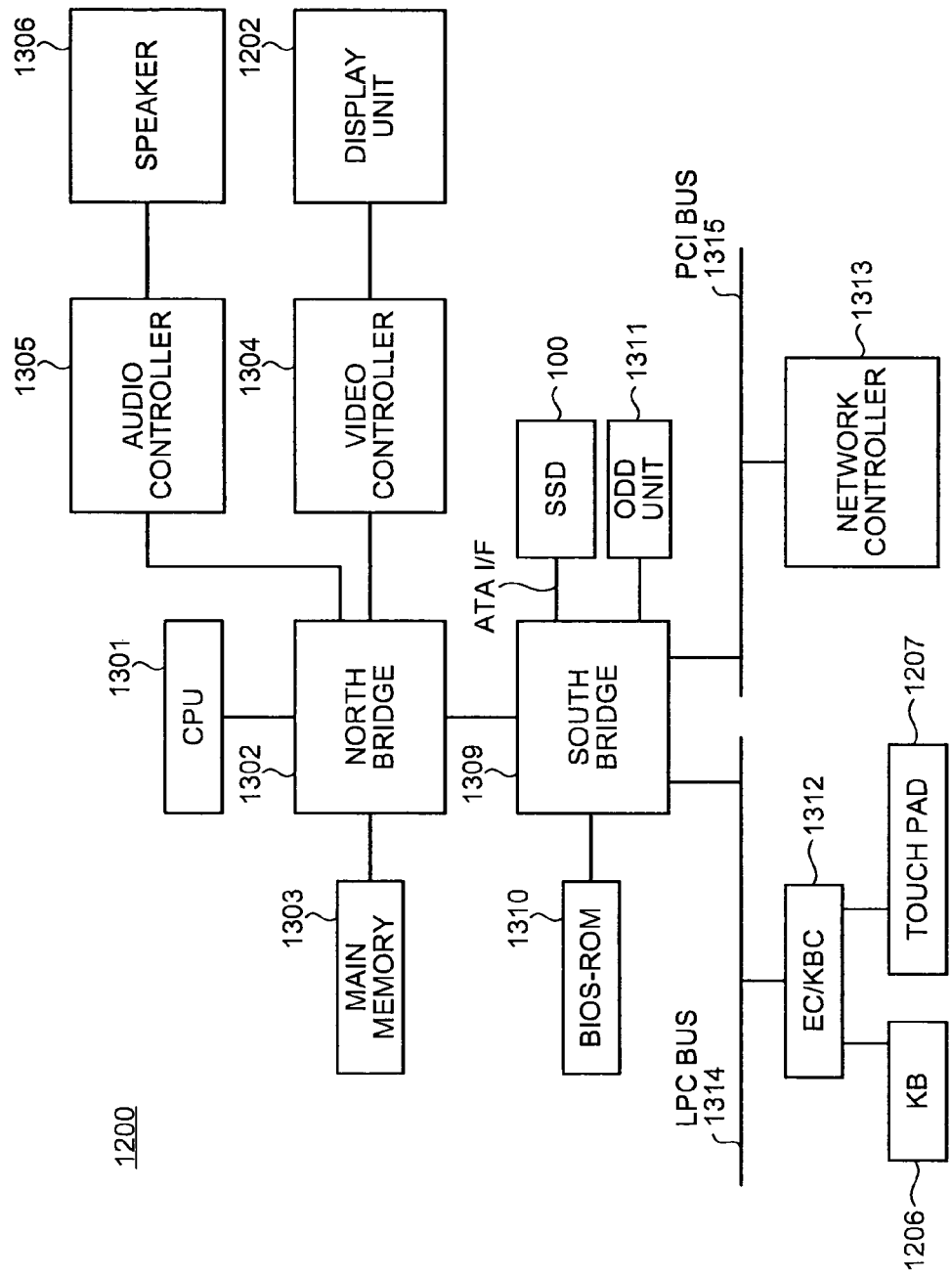
FIG. 26 is a diagram of a system configuration example of the PC on which the SSD is mounted.

FIG. 26 is a diagram of a system configuration example of the PC 1200 on which the SSD 100 is mounted. The PC 1200 includes a CPU 1301, a north bridge 1302, a main memory 1303, a video controller 1304, an audio controller 1305, a south bridge 1309, a basic input/output system read-only memory (BIOS-ROM) 1310, the SSD 100, an ODD unit 1311, an embedded controller/keyboard controller IC (EC/KBC) 1312, and a network controller 1313.

The CPU 1301 is a processor for controlling an operation of the PC 1200, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS stored in the BIOS-ROM 1310. The system BIOS is a computer program for controlling a hardware of the PC 1200.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 through an accelerated graphics port (AGP) bus and the like.

The main memory 1303 temporarily stores therein a computer program and data, and functions as a work area of the CPU 1301. The main memory 1303, for example, consists of a DRAM.

The video controller 1304 is a video reproduction controller for controlling the display unit 1202 used as a display monitor of the PC 1200.

The audio controller 1305 is an audio reproduction controller for controlling a speaker 1306 of the PC 1200.

The south bridge 1309 controls each device on a low pin count (LPC) bus 1314 and each device on a peripheral component interconnect (PCI) bus 1315. Moreover, the south bridge 1309 controls the SSD 100 that is a memory device storing various types of software and data through the ATA interface.

The PC 1200 accesses the SSD 100 in sector units. A write command, a read command, a flush command, and the like are input to the SSD 100 through the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard (KB) 1206 and the touch pad 1207 are integrated.

The EC/KBC 1312 has a function of turning on/off the PC 1200 based on an operation of a power button by a user. The network controller 1313 is, for example, a communication device that executes communication with an external network such as the Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system comprising:
   a cache memory;
   a nonvolatile semiconductor memory in which data is written via the cache memory;
   an organizing unit that increases, in response to a resource usage of the nonvolatile semiconductor memory exceeding a specific value, a resource of the nonvolatile semiconductor memory by organizing the data in the nonvolatile semiconductor memory;
   a first flush control unit; and
   a second flush control unit,
   wherein the first flush control unit is configured to perform, in response to
      the resource usage of the cache memory exceeding a first threshold and being smaller than a second threshold that is larger than the first threshold, and
      organizing by the organizing unit being finished when a write request is not kept waiting after data write processing to the cache memory is performed,
   a first flush processing for flushing data in the cache memory to the nonvolatile semiconductor memory until a resource usage of the cache memory becomes equal to or less than the first threshold, and
   wherein the first flush control unit does not perform the first flush processing but accepts the write request in response to the resource usage of the cache memory exceeding the first threshold and being smaller than the second threshold when the write request is kept waiting after the data write processing to the cache memory is performed,
   wherein the second flush control unit performs, in response to the write request not being kept waiting after the data write processing to the cache memory is performed when the resource usage of the cache memory exceeds the second threshold, a second flush processing that includes:
      flushing the data in the cache memory to the nonvolatile semiconductor memory until the resource usage of the cache memory becomes equal to or less than the second threshold when organizing by the organizing unit is finished, and
      flushing, when organizing by the organizing unit is not finished by waiting until organizing by the organizing unit is finished, the data in the cache memory to the nonvolatile semiconductor memory until the resource usage of the cache memory becomes equal to or less than the second threshold,
   wherein the second flush control unit performs, in response to the write request being kept waiting after the data write processing to the cache memory is performed when the resource usage of the cache memory exceeds the second threshold, the second flush processing before accepting the write request.

2. The memory system according to claim 1, wherein the first flush control unit performs the first flush processing when the write request is not kept waiting after the second flush processing is performed by the second flush control unit.

3. The memory system according to claim 1, wherein
   the first flush control unit and the second flush control unit monitor a plurality of resource usages in the cache memory,
   the first flush control unit performs the first flush processing when any of the resource usages exceeds the first threshold that is set for each of the resource usages of the cache memory, and
   the second flush control unit performs the second flush processing when any of the resource usages exceeds the second threshold that is set for each of the resource usages of the cache memory.

4. The memory system according to claim 3, wherein
   the nonvolatile semiconductor memory includes a plurality of physical blocks as a unit of data erasing, each of the physical blocks includes a plurality of physical pages as a unit of data reading and data writing, a logical block associated with one or more of the physical blocks is allocated to each of a first management storage area, a second management storage area, and a third management storage area,
   the first flush control unit and the second flush control unit flush a plurality of data in sector units written in the cache memory to the first management storage area as data in first management units, and flush the plurality of data in sector units written in the cache memory to the second management storage area as data in second management units that is twice or a larger natural number times as large as the first management units, and
   the organizing unit executes:
      first processing for relocating an oldest logical block registered in the first management storage area to the third management storage area when a number of logical blocks in the first management storage area exceeds a tolerance;
      second processing for selecting a plurality of valid data in first management units and copying selected valid data in a new logical block when a number of logical blocks in the third management storage area exceeds a tolerance; and
      third processing for integrating the plurality of valid data in first management units into data in second management units and flushing the data in second management units to the second management storage area when a number of logical block in the third management storage area exceeds a tolerance.

5. The memory system according to claim 4, wherein the resource usage of the cache memory includes at least one of a number of valid data in first management units written in the cache memory, a number of valid data in second management units written in the cache memory, a number of data in second management units in which a valid sector and data in first management units are fully included, and a number of ways unused in the cache memory.

6. The memory system according to claim 5, wherein the first flush control unit and the second flush control unit perform the first flush processing and the second flush processing by referring to:
- a first management table that includes a plurality of indexes to each of which a lower few bits of an address in second management units are allocated and entries including a plurality of ways for each of the indexes, and stores an address in second management units corresponding to data written in the cache memory and pointer information that indicates a storing position of management information on data in first management units included in an address range in second management units for each of the entries; and
- a second management table that is management information indicated by the pointer information, includes first information that indicates a storing position of data in first management units while associating with an address in first management units, second information that indicates a sector securing valid data among a plurality of sectors included in an address range in first management units, third information that indicates a number of valid data in first management units included in the address range in second management units, and fourth information that indicates a number of data in first management units which is included in the address range in second management units and in which a valid sector is fully included, and manages a chronological order of data written in the cache memory for each address in second management units and a number of valid data in second management units written in the cache memory.

7. The memory system according to claim 4, wherein the first flush control unit and the second flush control unit, when flushing data written in the cache memory to the nonvolatile semiconductor memory, flush low-density data in second management units that includes valid data in first management units less than a specific ratio to the first management storage area and flush high-density data in second management units that includes valid data in first management units more than the specific ratio to the second management storage area.

8. The memory system according to claim 7, wherein the resource usage of the cache memory includes at least one of a number of valid data in first management units written in the cache memory, a number of valid data in second management units written in the cache memory, a number of data in second management unit in which a valid sector and data in first management units are fully included, a number of ways unused in the cache memory, a number of data in second management units that includes valid data in first management units more than the specific ratio, and a number of data in first management units included in data in second management unit that includes valid data in first management units less than the specific ratio.

9. The memory system according to claim 8, wherein the first flush control unit and the second flush control unit perform the first flush processing and the second flush processing by referring to:
- a first management table that includes a plurality of indexes to each of which a lower few bits of an address in second management units are allocated and entries including a plurality of ways for each of the indexes, and stores an address in second management units corresponding to data written in the cache memory and pointer information that indicates a storing position of management information on data in first management units included in an address range in second management units for each of the entries;
- a second management table that is management information indicated by the pointer information, includes first information that indicates a storing position of data in first management units while associating with an address in first management units, second information that indicates a sector securing valid data among a plurality of sectors included in an address range in first management units, third information that indicates a number of valid data in first management units included in the address range in second management units, and fourth information that indicates a number of data in first management units which is included in the address range in second management units and in which a valid sector is fully included, and manages a chronological order of data written in the cache memory for each address in second management units and a number of valid data in second management units written in the cache memory;
- a third management table that includes a plurality of indexes to each of which a lower few bits of an address in second management units are allocated and entries including a plurality of ways for each of the indexes, and stores an address in second management units corresponding to the high-density data for each of the entries; and
- a fourth management table that manages a total number of data in first management units included in the address range in second management units corresponding to the low-density data.

10. The memory system according to claim 9, wherein
the nonvolatile semiconductor memory includes a plurality of channel parallel operation elements each of which includes a plurality of memory chips, each of the memory chips includes the physical blocks, each of the channel parallel operation elements includes a plurality of banks each including the physical blocks capable of performing an interleave operation,
the first management table to the fourth management table manage data in second management units with a size same as a logical block associated with a plurality of physical blocks selected from the channel parallel operation elements, and
the third management table uses a bank address to which one to a plurality of bits on a least significant side of an address in second management units is allocated as the index.

11. The memory system according to claim 9, wherein
the nonvolatile semiconductor memory includes a plurality of channel parallel operation elements each of which includes a plurality of memory chips, each of the memory chips includes a plurality of planes capable of performing a parallel operation, each of the planes includes the physical blocks, each of the channel parallel operation elements includes a plurality of banks each including the physical blocks capable of performing an interleave operation,
the first management table to the fourth management table manage data in second management units with a size same as a logical block associated with a plurality of physical blocks selected from the channel parallel operation elements, and
the third management table uses a bank address to which one to a plurality of bits on an upper side of a plane address, to which one to a plurality of bits on a least significant side of an address in second management units is allocated, is allocated as the index.

12. The memory system according to claim 1, wherein the second threshold is set to a value capable of receiving a single data transfer to the cache memory without performing data flush from the cache memory to the nonvolatile semiconductor memory.

13. A memory system comprising:
a cache memory;
a nonvolatile semiconductor memory in which data is written via the cache memory;
an organizing unit that increases, in response to a resource usage of the nonvolatile semiconductor memory exceeding a specific value, a resource of the nonvolatile semiconductor memory by organizing the data in the nonvolatile semiconductor memory;
a first flush control unit that flushes, in response to
the resource usage of the cache memory exceeding a first threshold and being smaller than a second threshold that is larger than the first threshold, and
an organizing by the organizing unit being finished, data in the cache memory to the nonvolatile semiconductor memory until a resource usage of the cache memory becomes equal to or less than the first threshold and
a second flush control unit that performs:
first processing for flushing, in response to
the resource usage of the cache memory exceeding the second threshold, and
the organizing by the organizing unit being finished, the data in the cache memory to the nonvolatile semiconductor memory until the resource usage of the cache memory becomes equal to or less than the second threshold,
second processing for performing, in response to
the resource usage of the cache memory exceeding the second threshold,
the organizing by the organizing unit not being finished, and
the resource usage of the cache memory not exceeding a maximum value as a tolerance that is larger than the second threshold by further processing a write request,
data writing in the cache memory without flushing the data in the cache memory to the nonvolatile semiconductor memory, and
third processing for performing, in response to
the resource usage of the cache memory exceeding the second threshold,
the organizing by the organizing unit not being finished, and
the resource usage of the cache memory exceeding said maximum value by further processing the write request,
data writing in the cache memory after the organizing by the organizing unit is finished and the data in the cache memory is flushed to the nonvolatile semiconductor memory.

14. The memory system according to claim 13, wherein the second flush control unit performs the first processing when the write request is not kept waiting after data write processing to the cache memory is performed, and performs the second processing or the third processing when the write request is kept waiting after the data write processing to the cache memory is performed.

15. A method of controlling a memory system that includes a cache memory and a nonvolatile semiconductor memory in which data is written via the cache memory, the method comprising:
performing organizing processing for increasing a resource of the nonvolatile semiconductor memory by organizing the data in the nonvolatile semiconductor memory in response to a resource usage of the nonvolatile semiconductor memory exceeding a specific value;
performing, in response to
the resource usage of the cache memory exceeding a first threshold and being smaller than a second threshold that is larger than the first threshold, and
organizing processing being finished when a write request is not kept waiting after data write processing to the cache memory is performed, a first flush processing for flushing data in the cache memory to the nonvolatile semiconductor memory until a resource usage of the cache memory becomes equal to or less than the first threshold;
accepting the write request without performing the first flush processing in response to the resource usage of the cache memory exceeding the first threshold and being smaller than the second threshold when the write request is kept waiting after the data write processing to the cache memory is performed;
performing, in response to the write request not being kept waiting after the data write processing to the cache memory is performed when the resource usage of the cache memory exceeds the second threshold, a second flush processing that includes:
flushing the data in the cache memory to the nonvolatile semiconductor memory until the resource usage of the cache memory becomes equal to or less than the second threshold when organizing processing is finished;
flushing, when organizing processing is not finished by waiting until organizing processing is finished, the data in the cache memory to the nonvolatile semiconductor memory until the resource usage of the cache memory becomes equal to or less than the second threshold; and
performing, in response to the write request being kept waiting after the data write processing to the cache memory is performed when the resource usage of the cache memory exceeds the second threshold, the second flush processing before accepting the write request.

16. The method according to claim 15, wherein the first flush processing is performed when the write request is not kept waiting after the second flush processing is performed.

17. The method according to claim 15, wherein
the cache memory is monitored with a plurality of resource usages,
the first flush processing is performed when any of the resource usages exceeds the first threshold that is set for each of the resource usages of the cache memory, and
the second flush processing is performed when any of the resource usages exceeds the second threshold that is set for each of the resource usages of the cache memory.

18. The method according to claim 17, wherein
the nonvolatile semiconductor memory includes a plurality of physical blocks as a unit of data erasing,
each of the physical blocks includes a plurality of physical pages as a unit of data reading and data writing, a logical block associated with one or more of the physical blocks is allocated to each of a first management storage area, a second management storage area, and a third management storage area, the first flush processing and the second flush processing includes:
flushing a plurality of data in sector units written in the cache memory to the first management storage area as data in first management unit; and
flushing the plurality of data in sector units written in the cache memory to the second management storage area as data in second management units that is twice or a larger natural number times as large as the first management units, and the organizing processing includes:
first processing for relocating an oldest logical block registered in the first management storage area to the third management storage area when a number of logical blocks in the first management storage area exceeds a tolerance;
second processing for selecting a plurality of valid data in first management units and copying selected valid data in a new logical block when a number of logical blocks in the third management storage area exceeds a tolerance; and
third processing for integrating the plurality of valid data in first management units into data in second management units and flushing the data in second management units to the second management storage area when a number of logical block in the third management storage area exceeds a tolerance.

19. The method according to claim 18, wherein the resource usage of the cache memory includes at least one of a number of valid data in first management units written in the cache memory, a number of valid data in second management units written in the cache memory, a number of data in second management units in which a valid sector and data in first management units are fully included, and a number of ways unused in the cache memory.

20. The method according to claim 19, wherein
the first flush processing and the second flush processing include referring to:
a first management table that includes a plurality of indexes to each of which a lower few bits of an address in second management units are allocated and entries including a plurality of ways for each of the indexes, and stores an address in second management units corresponding to data written in the cache memory and pointer information that indicates a storing position of management information on data in first management units included in an address range in second management units for each of the entries; and
a second management table that is management information indicated by the pointer information, includes first information that indicates a storing position of data in first management units while associating with an address in first management units, second information that indicates a sector securing valid data among a plurality of sectors included in an address range in first management units, third information that indicates a number of valid data in first management units included in the address range in second management units, and fourth information that indicates a number of data in first management units which is included in the address range in second management units and in which a valid sector is fully included, and manages a chronological order of data written in the cache memory for each address in second management units and a number of valid data in second management units written in the cache memory.

21. The method according to claim 18, wherein
the first flush processing and the second flush processing, when flushing data written in the cache memory to the nonvolatile semiconductor memory, includes:
flushing low-density data in second management units that includes valid data in first management units less than a specific ratio to the first management storage area; and
flushing high-density data in second management units that includes valid data in first management units more than the specific ratio to the second management storage area.

22. The method according to claim 21, wherein the resource usage of the cache memory includes at least one of a number of valid data in first management units written in the cache memory, a number of valid data in second management units written in the cache memory, a number of data in second management unit in which a valid sector and data in first management units are fully included, a number of ways unused in the cache memory, a number of data in second management units that includes valid data in first management units more than the specific ratio, and a number of data in first management units included in data in second management unit that includes valid data in first management units less than the specific ratio.

23. The method according to claim 22, wherein
the first flush processing and the second flush processing include referring to:
a first management table that includes a plurality of indexes to each of which a lower few bits of an address in second management units are allocated and entries including a plurality of ways for each of the indexes, and stores an address in second management units corresponding to data written in the cache memory and pointer information that indicates a storing position of management information on data in first management units included in an address range in second management units for each of the entries;
a second management table that is management information indicated by the pointer information, includes first information that indicates a storing position of data in first management units while associating with an address in first management units, second information that indicates a sector securing valid data among a plurality of sectors included in an address range in first management units, third information that indicates a number of valid data in first management units included in the address range in second management units, and fourth information that indicates a number of data in first management units which is included in the address range in second management units and in which a valid sector is fully included, and manages a chronological order of data written in the cache memory for each address in second management units and a number of valid data in second management units written in the cache memory;
a third management table that includes a plurality of indexes to each of which a lower few bits of an address in second management units are allocated and entries including a plurality of ways for each of the indexes, and stores an address in second management units corresponding to the high-density data for each of the entries; and a fourth management table that manages a total number of data in first management units included in the address range in second management units corresponding to the low-density data.

24. The method according to claim 23, wherein
the nonvolatile semiconductor memory includes a plurality of channel parallel operation elements each of which includes a plurality of memory chips,
each of the memory chips includes the physical blocks,
each of the channel parallel operation elements includes a plurality of banks each including the physical blocks capable of performing an interleave operation,
the first management table to the fourth management table manage data in second management units with a size same as a logical block associated with a plurality of physical blocks selected from the channel parallel operation elements, and
the third management table uses a bank address to which one to a plurality of bits on a least significant side of an address in second management units is allocated as the index.

25. The method according to claim 23, wherein
the nonvolatile semiconductor memory includes a plurality of channel parallel operation elements each of which includes a plurality of memory chips,
each of the memory chips includes a plurality of planes capable of performing a parallel operation,
each of the planes includes the physical blocks,
each of the channel parallel operation elements includes a plurality of banks each including the physical blocks capable of performing an interleave operation,
the first management table to the fourth management table manage data in second management units with a size same as a logical block associated with a plurality of physical blocks selected from the channel parallel operation elements, and
the third management table uses a bank address to which one to a plurality of bits on an upper side of a plane address, to which one to a plurality of bits on a least significant side of an address in second management units is allocated, is allocated as the index.

26. The method according to claim 15, wherein the second threshold is set to a value capable of receiving a single data transfer to the cache memory without performing data flush from the cache memory to the nonvolatile semiconductor memory.

27. A method of controlling a memory system that includes a cache memory and a nonvolatile semiconductor memory in which data is written via the cache memory, the method comprising:
performing organizing processing for increasing a resource of the nonvolatile semiconductor memory by organizing the data in the nonvolatile semiconductor memory when a resource usage of the nonvolatile semiconductor memory exceeds a specific value;
performing, in response to
the resource usage of the cache memory exceeding a first threshold and being smaller than a second threshold that is larger than the first threshold, and
the organizing by an organizing unit being finished, first flush processing for flushing data in the cache memory to the nonvolatile semiconductor memory until a resource usage of the cache memory becomes equal to or less than the first threshold;
performing second flush processing that includes:
first processing for flushing, in response to the resource usage of the cache memory exceeding the second threshold and the organizing by the organizing unit being finished, the data in the cache memory to the nonvolatile semiconductor memory until the resource usage of the cache memory becomes equal to or less than the second threshold;
second processing for performing, in response to
the resource usage of the cache memory exceeding the second threshold,
the organizing by the organizing unit not being finished, and
the resource usage of the cache memory not exceeding a maximum value as a tolerance that is larger than the second threshold by further processing a write request, data writing in the cache memory without flushing the data in the cache memory to the nonvolatile semiconductor memory; and
third processing for performing, in response to
the resource usage of the cache memory exceeding the second threshold,
the organizing by the organizing unit not being finished, and
the resource usage of the cache memory exceeding said maximum value by further processing the write request, data writing in the cache memory after the organizing by the organizing unit is finished and the data in the cache memory is flushed to the nonvolatile semiconductor memory.

28. The method according to claim 27, wherein
the first flush processing is performed when the write request is not kept waiting after data write processing to the cache memory is performed, and
the second processing or the third processing is performed when the write request is kept waiting after the data write processing to the cache memory is performed.

29. An information processing apparatus comprising:
a CPU;
a main storage memory; and
an external storage device, wherein the external storage device includes:
a cache memory;
a nonvolatile semiconductor memory in which data is written via the cache memory;
an organizing unit that increases, in response to a resource usage of the nonvolatile semiconductor memory exceeding a specific value, a resource of the nonvolatile semiconductor memory by organizing the data in the nonvolatile semiconductor memory;
a first flush control unit; and
a second flush control unit,
wherein the first flush control unit is configured to perform, in response to
the resource usage of the cache memory exceeding a first threshold and being smaller than a second threshold that is larger than the first threshold, and
organizing by the organizing unit being finished when a write request is not kept waiting after data write processing to the cache memory is performed, a first flush processing for flushing data in the cache memory to the nonvolatile semiconductor memory until a resource usage of the cache memory becomes equal to or less than the first threshold,
wherein the first flush control unit does not to perform the first flush processing but accepts the write request in response to the resource usage of the cache memory exceeding the first threshold and being smaller than the second threshold when the write request is kept waiting after the data write processing to the cache memory is performed wherein the second flush control unit performs, in response to the write request not being kept waiting after the data write processing to the cache memory is performed when the resource usage of the cache memory exceeds the second threshold, a second flush processing that includes:

flushing the data in the cache memory to the nonvolatile semiconductor memory until the resource usage of the cache memory becomes equal to or less than the second threshold when organizing by the organizing unit is finished, and flushing, when organizing by the organizing unit is not finished by waiting until organizing by the organizing unit is finished, the data in the cache memory to the nonvolatile semiconductor memory until the resource usage of the cache memory becomes equal to or less than the second threshold, wherein the second flush control unit performs, in response to the write request being kept waiting after the data write processing to the cache memory is performed when the resource usage of the cache memory exceeds the second threshold, the second flush processing before accepting the write request.

\* \* \* \* \*